(12) United States Patent
Solczynski et al.

(10) Patent No.: US 12,017,220 B2
(45) Date of Patent: Jun. 25, 2024

(54) MICROFLUIDIC CHIP AND VALVE, PRODUCTION PROCESS AND USES

(71) Applicant: CURIOSITY DIAGNOSTICS SP. Z O.O., Warsaw (PL)

(72) Inventors: Pawel Solczynski, Warsaw (PL); Piotr Garstecki, Warsaw (PL)

(73) Assignee: CURIOSITY DIAGNOSTICS SP. Z O.O., Warsaw (PL)

( * ) Notice: Subject to any disclaimer, the term of this patent is extended or adjusted under 35 U.S.C. 154(b) by 57 days.

(21) Appl. No.: 17/626,611

(22) PCT Filed: Jul. 13, 2020

(86) PCT No.: PCT/EP2020/069703
§ 371 (c)(1),
(2) Date: Jan. 12, 2022

(87) PCT Pub. No.: WO2021/009096
PCT Pub. Date: Jan. 21, 2021

(65) Prior Publication Data
US 2022/0241785 A1   Aug. 4, 2022

(30) Foreign Application Priority Data
Jul. 12, 2019 (EP) .................................... 19186118

(51) Int. Cl.
*B01L 3/00* (2006.01)
*B81B 1/00* (2006.01)
*B81C 1/00* (2006.01)

(52) U.S. Cl.
CPC ........ *B01L 3/502738* (2013.01); *B81B 1/006* (2013.01); *B81C 1/00119* (2013.01); *B01L 2200/027* (2013.01); *B01L 2200/12* (2013.01); *B01L 2300/0609* (2013.01); *B01L 2300/123* (2013.01); *B01L 2400/0638* (2013.01); *B81B 2201/054* (2013.01); *B81B 2203/0338* (2013.01); *B81B 2203/0353* (2013.01)

(58) Field of Classification Search
None
See application file for complete search history.

(56) References Cited

U.S. PATENT DOCUMENTS

| 4,858,883 | A | 8/1989 | Webster |
| 7,607,641 | B1 | 10/2009 | Yuan |
| 2003/0030023 | A1 | 2/2003 | Wang et al. |

(Continued)

FOREIGN PATENT DOCUMENTS

| CN | 101267885 A | 9/2008 |
| CN | 103282706 A | 9/2013 |

(Continued)

OTHER PUBLICATIONS

European Search Report dated Sep. 10, 2019 from counterpart European Patent Application No. 19186118.6.

(Continued)

*Primary Examiner* — Lyle Alexander
*Assistant Examiner* — Bryan Kilpatrick
(74) *Attorney, Agent, or Firm* — SHUTTLEWORTH & INGERSOLL, PLC; Timothy J. Klima

(57) ABSTRACT

The present invention relates to a microfluidic chip and valve, production process and uses thereof according to the independent claims.

20 Claims, 7 Drawing Sheets

(56) References Cited

U.S. PATENT DOCUMENTS

| | | | |
|---|---|---|---|
| 2010/0172803 A1* | 7/2010 | Stone | B01L 3/5027 422/400 |
| 2011/0076204 A1* | 3/2011 | Schmidt | F04B 43/12 417/474 |
| 2018/0333721 A1 | 11/2018 | Fernandez et al. | |

FOREIGN PATENT DOCUMENTS

| | | |
|---|---|---|
| CN | 105135051 A | 12/2015 |
| CN | 105536898 A | 5/2016 |
| CN | 108136388 A | 6/2018 |
| CN | 108953758 A | 12/2018 |
| CN | 208288041 U | 12/2018 |
| CN | 109307102 A | 2/2019 |
| CN | 208449338 U | 2/2019 |
| CN | 109536364 A | 3/2019 |
| DE | 19816283 A1 | 10/1999 |
| DE | 102006010956 A1 | 9/2007 |
| DE | 102010001412 A1 | 8/2011 |
| EP | 3996844 B1 | 10/2022 |
| WO | WO-2014072053 A1 * 5/2014 | ............ B01L 3/502 |
| WO | 2018033609 A1 | 2/2018 |

OTHER PUBLICATIONS

International Search Report and Written Opinion dated Sep. 22, 2020 from International Patent Application No. PCT/EP2020/069703.

Chinese Office Action dated Aug. 25, 2022 for counterpart Chinese Patent Application No. 202080062325.6.

Notification of Registration issued by the Chinese Patent Office on Nov. 15, 2022 from counterpart Chinese Patent Application No. 202080062325.6.

Decision to Grant dated Sep. 29, 2022 from counterpart EP App No. 20739678.9.

Transmission of Certificate dated Nov. 8, 2022 from counterpart EP App No.

* cited by examiner

MICROFLUIDIC CHIP AND VALVE, PRODUCTION PROCESS AND USES

TECHNICAL FIELD

This application is the National Phase of International Application PCT/EP2020/069703 filed Jul. 13, 2020 which designated the U.S.

This application claims priority to European Patent Application No. 19186118.6 filed Jul. 12, 2019, which application is incorporated by reference herein.

The present invention relates to a microfluidic chip and valve, production process and uses thereof according to the present disclosure.

BACKGROUND ART

The field of microfluidic technology is advancing in providing solutions for processing a liquid composition, such as for conducting a chemical synthesis and/or chemical, biochemical and/or proteomic analysis, more preferably for conducting a biochemical assay selected from the group consisting of an enzymatic analysis, such as a glucose or a lactate assay; a DNA analysis, such as a polymerase chain reaction (PCR) and in particular a PCR with high-throughput sequencing.

In order to carry out such procedures it can be required to control liquid flow within the microfluidic device, such as a microfluidic chip. This controllable liquid flow is in particular relevant for—but not limited to—a microfluidic chip facilitating isolation of a nucleic acid in order to conduct a PCR analysis. In this regard, microfluidic channels are conventionally applied as part of the microfluidic network on a side of a microfluidic chip. It may be necessary, that different channels may be connectable and/or that liquid and/or gas flow needs to be controlled in time.

In order to optimize the spatial arrangement of the microfluidic network, the intersection angles of two or more microfluidic channels in a surface plane may differ in two or more areas, where the liquid flow shall be controlled. According to the prior art, where the microfluidic valve is arranged on the same side as the microfluidic channels to be connected/disconnected, it may be necessary to use two or more different geometric arrangements of the microfluidic valves and/or valve actuator means in order to facilitate control of liquid flow.

Thus, there is a need to provide a microfluidic valve, which can control liquid flow irrespective of the applicable intersection angle between the microfluidic channels to be connected/disconnected.

According to prior art solutions, microfluidic networks and in particular microfluidic valves generally exhibit a certain volume, so called dead volume, which relates to the portion of the internal volume that is out of the flow path. In other words, the liquid will be left over in the microfluidic valve and may, thus, contaminate other liquids, which in turn may be detrimental for conducting further processes with the contaminated solutions. For example, in case of a microfluidic chip facilitates isolation of nucleic acid and preferably also facilitates PCR analysis, a left over concentration of 1 Vol. % of lysis buffer is detrimental for conducting PCR analysis. In addition, an increased dead volume negatively affects the measurement accuracy of liquid volumes within the microfluidic channels. Accordingly, there is an ongoing demand to reduce the dead volume of microfluidic valves.

Furthermore, there exists an ongoing need in providing simple and cost effective production processes for such an improved microfluidic valve and microfluidic chip.

Thus, it is an aim of the present invention to provide an alternative and/or improved microfluidic valve for controlling liquid flow in a microfluidic channel, preferably
- wherein the microfluidic valve can be used for controlling liquid flow in microfluidic channels irrespective of the applicable intersection angle between the microfluidic channels to be connected/disconnected and/or
- wherein the dead volume of the microfluidic valve is optimized, more preferably reduced and/or
- wherein the production process of the microfluidic valve is simple and cost effective.

SUMMARY OF THE INVENTION

One or more problems of the present invention is/are solved by the subject matter of the independent claims, namely microfluidic valve, the microfluidic chip, production processes and uses thereof. Advantages (preferred embodiments) are set out in the detailed description hereinafter and/or the accompanying figures as well as in the dependent claims.

Accordingly, first aspect of the present invention relates to a microfluidic valve for controlling flow of a liquid in a microfluidic channel. The inventive microfluidic valve comprises a basic substrate, an elastomeric membrane with a thickness $d_{EM}=d$ in relaxed state, and a top substrate respectively having opposed upper and lower surfaces. The top substrate is secured to the basic substrate thereby clenching the elastomeric membrane between the upper surface of the basic substrate and the lower surface of the top substrate. In other words, the lower surface of the elastomeric membrane is arranged adjacent to the upper surface of the basic substrate and the lower surface of the top substrate is arranged adjacent to the upper surface of the elastomeric membrane.

According to the first inventive aspect the basic substrate comprises on its upper surface a valve seat with a perimeter $p_V=x$ comprising a central recess with a perimeter $p_{CR} \leq x$, and a projection surrounding the valve seat with an inner perimeter $p_{Pi} \geq x$ and an outer perimeter $p_{Po} > p_{Pi}$.

Furthermore, according to the first inventive aspect, the microfluidic valve has a distance between the upper surface of the basic substrate and the lower surface plane of the top substrate measured perpendicular to the lower surface plane. The distance is respectively $d_{BTLS} \geq d$ outside the perimeter $p_{Po}$ of the projection, $d_{CR} > d$ within the perimeter $p_{CR}$ of the central recess, and is $d_P < d$ between the perimeters $p_{Pi}$ and $p_{Po}$ of the projection.

Furthermore, according to the first inventive aspect the top substrate has a through hole from its lower to upper surface with a perimeter $p_{TH} \leq p_{Pi}$, which is arranged in register to the valve seat thereby providing access for a valve actuator means. This through hole facilitates that the valve actuator means can be used to deform the elastomeric membrane within the area of the valve seat in order to control the liquid flow in the microfluidic channel.

Furthermore, according to the first inventive aspect the central recess forms on the upper surface of the basic substrate a recess of longitudinal shape and comprises an inlet opening and a separate outlet opening, which are respectively connected to microfluidic channels upstream and downstream of the valve by respective connection channels, and wherein the connection channels are independently of each other arranged in angular position to the upper surface of the basic substrate. In other words, the connection channels fluidicly connect the central recess, which is arranged on the upper surface of the basic substrate, with the microfluidic channels upstream and downstream of the valve, which are independently from each other arranged in another plane in the basic substrate spaced from the upper substrate. Accordingly, the connection channels are arranged in angular position to the upper surface of the basic substrate, which means that they are not arranged in the same plane of the upper surface of the basic substrate.

In addition, according to the first inventive aspect the elastomeric membrane is configured to not be in contact with the surface of the central recess in open valve state thereby forming a valve cavity, which fluidicly connects the connection channels upstream and downstream of the valve, and to be deformable by the valve actuator means so that in closed valve state the elastomeric membrane closes the fluidic connection between the inlet and outlet openings in the central recess.

In view of the fact, that the microfluidic valve is inventively arranged on the upper surface of the basic substrate, whereas the microfluidic channels upstream and downstream of the microfluidic valve are arranged in another plane connected via two connection channels to the microfluidic valve, the same microfluidic valve can be used for controlling liquid flow in microfluidic channels irrespective of the applicable intersection angle between the microfluidic channels to be connected/disconnected.

As the same microfluidic valve can be used, also the same valve actuator means can be used for different microfluidic valves, which further simplifies the operation of the valve and accordingly reduces its costs. This is in particular relevant, as the inventive microfluidic valve does not require a certain specific configuration of the valve actuator means and/or its arrangement within the perimeter $p_{TH}$ of the through hole of the top substrate. The valve actuator means generally has to fit within the perimeter prH of the through hole of the top substrate, but can be bigger than the perimeter $p_{CR}$ of the central recess within the valve seat, as in closed valve state the deformable elastomeric membrane will fill the valve cavity in view of the applied pressure and, thus, closes the fluid connection.

Furthermore, the inventive microfluidic valve allows for optimizing, preferably reducing the dead volume of the microfluidic valve, as the dead volume only relates to that internal volume of the valve cavity, which is out of the liquid flow path.

In addition, the inventive microfluidic valve can at the same time be manufactured in a simple and cost effective way, as conventional materials for the elastomeric membrane and top substrate may be used. In other words, the elastomeric membrane does not have to be preprocesses and both the lower and upper surface of the elastomeric can be even and the elastomeric membrane can have the same thickness throughout the surface area. This advantage is in particular due to the inventive arrangement of the valve seat and the projection surrounding the valve seat on the upper surface of the basic substrate in combination with the respective distances between the upper surface of the basic substrate in relation to the lower surface plane of the top substrate. The inventive requirements facilitate that the elastomeric membrane is clenched between the lower surface of the top substrate and the projection in such a way that the valve seat is sealed in upper direction. Accordingly, an elastomeric membrane of conventional thickness and hardness can be used, which neither needs to undergo preprocessing, such as applying recesses in order to facilitate sealing of the valve seat, nor requires precise positioning relative to the valve seat and/or the top substrate. In contrast thereto, the prior art teaches either to use multiple elastomeric membranes (also called diaphragms) or to preprocess an elastomeric membrane in particular by introducing one or more recesses into the lower surface of the elastomeric membrane in order to fit with the valve seat of the prior art. Another advantage of the clenched arrangement of the elastomeric membrane according to the present invention is that the cumbersome manufacture step of attaching the elastomeric membrane to the basic substrate, such as with an adhesive, is altogether avoided. The manufacture process is, thus, greatly simplified.

According to the second aspect of the present invention a microfluidic chip is provided, which comprises a microfluidic channel network and one or more of the microfluidic valves according to the first aspect of the present invention.

In addition to the advantages of the first inventive aspect, the inventive microfluidic chip shows in particular advantages in case two or more inventive valves are used for connecting microfluidic channels with different intersection angles. This in turn means that the same (un-preprocessed) elastomeric membrane and/or the same valve actuator means can be used for each of different microfluidic valves.

According to the third aspect of the present invention, a process for producing the inventive microfluidic valve or the inventive microfluidic chip is provided, characterized in that the process comprises or consists of the following steps:

a. Providing a basic substrate, an elastomeric membrane and a top substrate as respectively defined in any one of the first and/or second aspects of the present invention, wherein the basic substrate has an upper and lower surface and comprises on its upper surface a valve seat with a perimeter $p_v=x$ comprising a central recess with a perimeter $p_{CR} \leq x$, and a projection surrounding the valve seat with an inner perimeter $p_{Pi} \geq x$ and an outer perimeter $p_{Po} > p_{Pi}$, wherein the central recess comprises an inlet opening and a separate outlet opening, which are respectively connected to microfluidic channels upstream and downstream of the valve by respective connection channels, and wherein the connection channels are independently of each other arranged in angular position to the upper surface of the basic substrate, and wherein the central recess forms on the upper surface of the basic substrate a recess of longitudinal shape, wherein the elastomeric membrane has opposed upper and lower surfaces and a thickness $d_{EM}=d$ in relaxed state, wherein the top substrate has opposed upper and lower surfaces and has a through hole from its lower to upper surface with a perimeter $p_{TH} \leq p_{Pi}$, b. Arranging the lower surface of the elastomeric membrane on the upper surface of the basic substrate and arranging the lower surface of the top substrate on the upper surface of the elastomeric membrane, thereby arranging the through hole of the top substrate having a perimeter $p_{TH} \leq p_{Pi}$ in register to the perimeter $p_V$ of the valve seat, and c. Securing the top substrate to the basic substrate thereby clenching the elastomeric membrane to the basic substrate in such a way that the valve seat is sealed in upper direction, whereby the elastomeric membrane is configured to not be in contact with the surface of the central recess in open valve state thereby forming a valve cavity, which fluidicly connects the connection channels upstream and downstream of the valve, and to be deformable by a valve actuator means so that in closed valve state the elastomeric membrane closes fluidic connection between the inlet and outlet openings in the central recess.

In addition to the advantages described with respect to the first and second aspects of the present invention, the inventive production process allows a simple and cost effective assembly of the basic substrate, the elastomeric membrane and the top substrate. As already mentioned above, the same elastomeric membrane can be used for each of the inventive microfluidic valves. This means, that a greater freedom in positioning the layers of elastomeric membrane and top substrate as well as basic substrate respectively relative to each other exists for the inventive production process.

According to the fourth aspect of the present invention, a use of the microfluidic valve according to first inventive aspect or a microfluidic chip according to the second aspect of the present invention or a microfluidic chip obtainable according to the third inventive aspect is provided for controlling flow of a liquid composition in a microfluidic channel of a microfluidic channel network.

The inventive aspects of the present invention as disclosed hereinbefore can comprise any possible (sub-)combination of the preferred inventive embodiments as set out in the dependent claims or as disclosed in the following detailed description and/or in the accompanying figures, provided the resulting combination of features is reasonable to a person skilled in the art.

BRIEF DESCRIPTION OF THE DRAWINGS

Further characteristics and advantages of the present invention will ensue from the accompanying drawings, wherein.

Figure 1A:
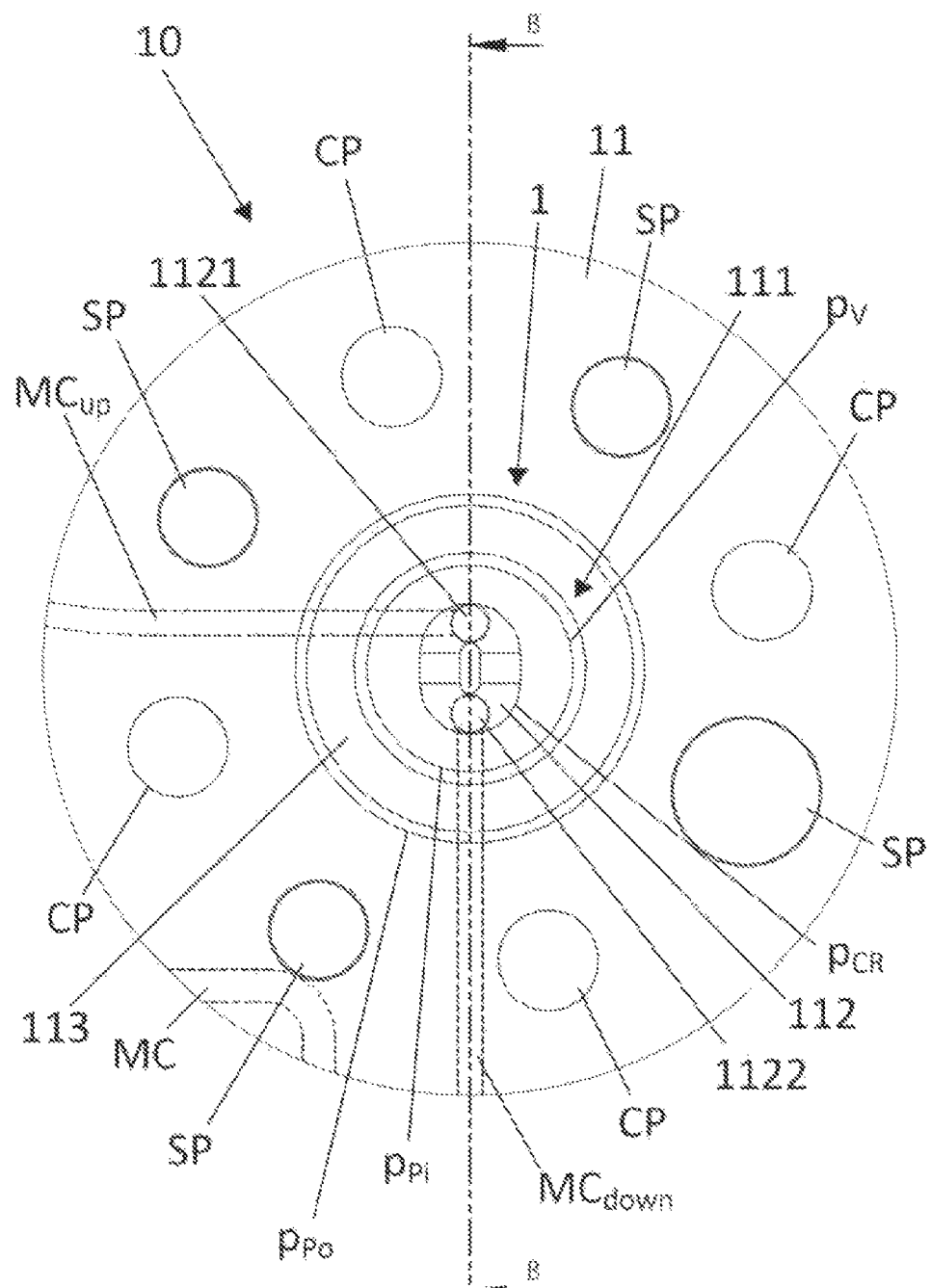
FIG. 1A represents a simplified top view of a part of an inventive microfluidic valve and chip with cross section plane B-B.

Dimensions, such as distances, volumes, concentrations, ratios and hardness properties provided in the context of the present invention, in particular in the following description shall comprise suitable deviations in the art respectively applicable to the respective dimensions and/applications of the present invention.

DETAILED DESCRIPTION OF THE INVENTION

As already mentioned in the summary section of the present invention and set out in more detail hereinafter, the inventors of the different aspects of the present invention have found out that inventive aspects according to the independent claims, in particular the inventive microfluidic valve, the inventive microfluidic chip comprising one or more inventive valves, the inventive production process and inventive use facilitate controlling liquid flow in a microfluidic channel wherein the microfluidic valve can be used for controlling liquid flow in microfluidic channels irrespective of the applicable intersection angle between the microfluidic channels to be connected/disconnected and wherein the same valve actuator means can be used for operating the microfluidic valve, and wherein the valve actuator only needs to fit within the perimeter prH of the through hole of the top substrate in register with the valve seat of the basic substrate, and wherein the dead volume of the microfluidic valve is optimized, more preferably reduced, and wherein any suitable valve actuator can be used, provided it fits within the perimeter prH of the through hole in the top substrate in register with the valve seat of the basic substrate, and wherein the production process of the microfluidic valve is simple and cost effective.

In addition to these advantages the inventive microfluidic chip shows in particular advantages in case two or more inventive valves are used for connecting microfluidic channels with different intersection angles. This in turn means that the same (un-preprocessed) elastomeric membrane and/or the same valve actuator means can be used for each of different microfluidic valves, which simplifies the production process and, thus, reduces the costs.

Moreover, the inventive production process as such allows a simple and cost effective assembly of the basic substrate, the elastomeric membrane and the top substrate. As already mentioned above, the same elastomeric membrane can be used for each of the inventive microfluidic valves. This means, that a greater freedom in positioning the elastomeric membrane relative to both the top and the basic substrate exists. The elastomeric membrane does also not have to be preprocessed nor a plurality of elastomeric membranes have to be used on top of each other, which additionally reduces production costs.

Further specific advantages are described in detail hereinafter.

As already mentioned in the summary, microfluidic valve for controlling flow of a liquid in a microfluidic channel according to the first inventive aspect comprises a basic substrate, an elastomeric membrane with a thickness $d_{EM}=d$ in relaxed state, and a top substrate respectively having opposed upper and lower surfaces.

In accordance with the present invention, any suitable basic substrate can be used, which fulfills the inventive requirements and facilitates clenching of the elastomeric membrane by the top substrate and thereby sealing of the valve seat in upper direction. Preferably, the basic substrate is less flexible than the elastomeric membrane. More preferably, the basic substrate exhibits a hardness on the Rockwell R scale in the range of 50 to 130, preferably 120, and a thickness in the range of 1 mm to 5 mm, preferably approximately 2 mm.

More preferably, the material of the basic substrate is manufactured of suitable liquid and/or gas, preferably liquid and gas impermeable material. As a counter example, polydimethylsiloxane (PDMS) is not regarded suitable for manufacturing a fluid and gas impermeable basic substrate, as the substrate will be gas permeable. In case other processing means for processing the liquid to be flow controlled are arranged on the basic substrate of the inventive microfluidic valve, the basic substrate material should also preferably not interfere with the processing of the liquid. According to an additional or alternative preferred embodiment of the first aspect of the present invention, the material of the basic substrate facilitates in particular thermal and optical processing of the liquid, such as irradiation with electromagnetic waves, such as in the infrared and/or ultraviolet range and/or visible range and or optical inspection. Accordingly, the material of the basic substrate is preferably transparent to the respective irradiated and/or emitted wavelength, in order to reduce a negative impact on processing of the aliquot of liquid. Furthermore, it preferably withstands overpressure up to 5 bar, preferably up to 10 bar under operation without that material of the basic substrate or part thereof breaks, cracks, detaches, etc. and preferably can sustain the overpressure and prevent the release of any liquids and/or gas for at least 15 minutes, preferably for at least 30 minutes. Thus, according to an additional or alternative preferred embodiment of the first aspect of the present invention, the basic substrate is formed of a liquid and gas impermeable material selected from the group consisting of suitable glass and suitable polymers, wherein the polymers are preferably selected from the group consisting of polycarbonate, cyclic olefin copolymer, polystyrene, cyclic olefin polymer or poly(methyl methacrylate). More preferably, the substrate material is selected from polycarbonate.

In the context of the present invention, the expression "an additionally or alternatively further preferred embodiment" or "an additionally or alternatively preferred embodiment" or "an additional or alternative way of configuring this preferred embodiment" means that the feature or feature combination disclosed in this preferred embodiment can be combined in addition to or alternatively to the features of the inventive subject matter including any preferred embodiment of each of the inventive aspects, provided the resulting feature combination is reasonable to a person skilled in the art.

As already described in the summary of the present invention, the basic substrate comprises on its upper surface a valve seat with a perimeter $p_V = x$ comprising a central recess of longitudinal shape with a perimeter $p_{CR} \leq x$, and a projection surrounding the valve seat with an inner perimeter $p_{Pi} \geq x$ and an outer perimeter $p_{Po} > p_{Pi}$.

According to an additional or alternative preferred embodiment of the present invention, the valve seat has a perimeter $p_V$ in the range of 1 mm to 25 mm, more preferably 13 mm.

According to an additional or alternative preferred embodiment of the present invention, the central recess of longitudinal shape has a perimeter $p_{CR}$ in the range of 600 µm to 12.5 mm, more preferably 7.5 mm.

According to an additional or alternative preferred embodiment of the present invention, the projection surrounding the valve seat has an inner perimeter $p_{Pi}$ in the range of 1 mm to 25 mm, more preferably 13 mm and an outer perimeter $p_{Po}$ in the range of 1.5 mm to 40 mm, more preferably 22 mm. The projection can have any suitable form, preferably forms on the upper surface plane of the basic substrate a round shape, more preferably a ring shape or an oval or ellipse shape, or alternatively an angular shape, preferably a square shape or a rectangular shape.

According to an additional or alternative preferred embodiment of the present invention, the central recess of longitudinal shape is spaced from the perimeter of the valve seat with $p_{CR} < p_V = p_{Pi} < p_{Po}$ and the lower surface of the elastomeric membrane is at least in contact with the surface of the projection and the surface of the basic substrate between inner perimeter of the projection $p_{Pi}$ and perimeter of the central recess $p_{CR}$ such that in open valve state the valve cavity consists of the volume of the central recess.

In order to further reduce the dead volume, the projection is preferably spaced just as far away from the perimeter $p_{CR}$ of the central recess as needed to prevent the elastomeric membrane in view of its clenched configuration from being deformed, so called "flowing", into the central recess and thereby obstructing liquid flow through the valve cavity. More preferably, the projection is spaced also as little away from the perimeter $p_{CR}$ of the central recess as to substantially avoid liquid flow between the upper surface of the basic substrate and the lower surface of the elastomeric membrane outside the perimeter $p_{CR}$ of the central recess and especially outside the inner perimeter $p_{Pi}$ of the basic substrate both in open and closed valve state.

The elastomeric membrane to be used with respect to the first aspect of the present invention, generally exhibits suitable hardness and thickness in a relaxed state so that the clenched elastomeric membrane facilitates sealing of the valve seat in upper direction. Preferably, the hardness on Shore scale is in the range of 30 to 75, more preferably 60, and the thickness d is in the range of 0.7 mm to 1.8 mm, more preferably 1 mm.

In the context of the present invention, the expression "sealing of the valve seat in upper direction" means that the elastomeric membrane is clenched in such a way between the upper surface of the basic substrate and the lower surface of the top substrate in order to exhibit a liquid and/or gas, preferably a liquid and gas impermeable bonding to the projections of the basic substrate under operation. More preferably the liquid and/or gas, preferably the liquid and gas impermeable bonding withstands overpressure of up to 5 bar, more preferably up to 10 bar and can sustain the overpressure and prevent the release of any liquids and/or gas for at least 15 minutes, preferably for at least 30 minutes.

According to an additional or alternative preferred embodiment, the elastomeric membrane can be selected from suitable polymers, preferably can be selected from the group consisting of unsaturated rubbers, saturated rubbers, thermoplastic elastomers and silicone.

The above dimensions of the respective perimeters assist optimizing spatial arrangement of the inventive microfluidic valve and in particular assist reducing dead volume of the inventive microfluidic valve.

Furthermore, the elastomeric membrane to be used for the first aspect of the present invention is configured to not be in contact with the surface of the central recess in open valve state thereby forming a valve cavity, which fluidicly connects the connection channels upstream and downstream of the valve, and to be deformable by the valve actuator means so that in closed valve state the elastomeric membrane closes the fluidic connection between the inlet and outlet openings in the central recess. It is a further great advantage of the present invention that due to the inventive configuration of the valve seat, a valve actuator means, preferably a valve actuator pin, only has to generally fit within the perimeter prH of the through hole of the top substrate, which is in register with the valve seat of the basic substrate. As described in more detail with respect to the accompanying figures, the valve actuator means can have a cross section surface area bigger than the surface area of the central recess. In this case suitable pressure is applied through the valve actuator means in operation to the elastomeric membrane, the elastomeric membrane will deform and fill the valve cavity within the central recess at least partly and thereby stops liquid flow. The base surface of the valve actuator means can be flat or round or have any other suitable shape. The valve actuator means can also exhibit a cross section surface in plane of the upper surface of the basic substrate smaller than the surface area of the central recess. In this case, the suitable pressure applied by the valve actuator means to the elastomeric membrane will lead to deforming the elastomeric membrane and filling of the valve cavity with the elastomeric membrane in order to stop liquid flow.

Accordingly, the present invention allows to operate the microfluidic valve in a simpler and cost effective way.

Moreover, in accordance with the present invention, any suitable top substrate fulfilling the inventive requirements can be used in order to clench the elastomeric membrane to the basic substrate and thereby seal the valve seat in upper direction. This inventive feature allows avoiding the use of adhesives for sealing the elastomeric membrane to the basic substrate. According to an additional or alternative embodiment, the top substrate exhibits the same properties as set out with respect to the basic substrate above. More preferably, the material of the basic substrate and the top substrate is the same, even more preferably is selected from the group consisting of suitable glass and suitable polymers, wherein the polymers are preferably selected from the group consisting of polycarbonate, cyclic olefin copolymer, polystyrene, cyclic olefin polymer or poly(methyl methacrylate). More preferably, the substrate material is selected from polycarbonate.

As already described in the summary section of the present invention, a distance between the upper surface of the basic substrate and the lower surface plane of the top substrate measured perpendicular to the lower surface plane respectively is $d_{BTLS} \geq d$ outside the perimeter $p_{Po}$ of the projection, is $d_{CR} > d$ within the perimeter $p_{CR}$ of the central recess, and is $d_P < d$ between the perimeters $p_{Pi}$ and $p_{Po}$ of the projection.

According to an additional or alternative preferred embodiment of the present invention the distance $d_{BTLS}$ between the upper surface of the basic substrate and the lower surface plane of the top substrate measured perpendicular to the lower surface plane outside the perimeter $p_{CR}$ of the projection is in the range of d to 1.2*d, more preferably 1.1*d.

According to an additional or alternative preferred embodiment of the present invention the distance $d_{CR}$ between the upper surface of the basic substrate and the lower surface plane of the top substrate measured perpendicular to the lower surface plane within the perimeter $p_{CR}$ of the central recess is in the range of 1.1*d to 1.8*d, more preferably 1.4*d.

Such an arrangement allows for unobstructed flow of liquid, even a liquid comprising fine particulate matter, through the valve cavity, while also providing for a fluid-tight seal between the outlet and inlet openings in closed valve state under pressure differences between the inlet and outlet openings of up to 10 bar. The tightness of the valve is maintained in repeated usage for stopping flow of various liquid compositions, including aqueous liquids, hydrophobic liquids, such as olis, liquid solutions of detergents and liquid compositions comprising particulate matter.

According to an additional or alternative preferred embodiment of the present invention the distance $d_P$ between the upper surface of the basic substrate and the lower surface plane of the top substrate measured perpendicular to the lower surface plane between the perimeters $p_{Pi}$ and $p_{Po}$ of the projection is in the range of 0.3*d to 0.65*d, more preferably 0.6*d.

According to an additional or alternative preferred embodiment of the present invention, the valve seat surface area between the perimeters $p_{CR} < p_V$ and $p_V = p_{Pi}$ has a distance $d_{VS}$ from the upper surface of the basic substrate to the lower surface plane of the top substrate measured perpendicular to the lower surface plane $d_P < d_{VS} \leq d$, preferably $d_P < d_{VS} = d < d_{BTLS}$. In other words, the distance between the upper surface of the basic substrate within the inner perimeter of the projection and out of the perimeter of the central recess is of the same dimension as the thickness of the elastomeric membrane in relaxed state or smaller in order to facilitate contact of the elastomeric membrane with the valve seat outside of the central recess. Preferably, the distance $d_{VS}$ is chosen in such a way that in clenched position of the elastomeric membrane the liquid does essentially not flow between the elastomeric membrane surface and the basic substrate outside the perimeter of the central recess $p_{CR}$, but at the same time exhibits in open valve state the valve cavity in order to facilitate liquid flow from the microfluidic channel upstream to the inventive valve to the microfluidic channel downstream the inventive valve, i.e. is not too small, so as not to press the elastomeric membrane to the surface of the central recess and stop the liquid flow in open valve state. Even more preferably, the distance $d_{BTLS}$ between the upper surface of the basic substrate and the lower surface plane of the top substrate measured perpendicular to the lower surface plane outside the perimeter $p_{Po}$ of the projection is bigger than the distance $d_{VS}$. In this case, the pressure resulting from the clenching of the elastomeric membrane by the top substrate to the basic substrate is comparatively lower in the area outside of the perimeter of the projection than within the area of the projection and the valve seat. Such a configuration accordingly reduces wear of the inventive microfluidic valve.

The above dimensions of the respective distances between upper surface of the basic substrate and lower surface plane of the top substrate assist optimizing spatial arrangement of the inventive microfluidic valve and in particular assist reducing dead volume of the inventive microfluidic valve while providing for an unobstructed flow of liquid through the valve.

As already described in the summary section of the present invention, the top substrate has a through hole from its lower to upper surface with a perimeter $p_{TH} \leq p_{Pi}$, which is arranged in register to the valve seat thereby providing access for a valve actuator means.

Furthermore, as also described in the summary section of the present invention, the central recess comprises an inlet opening and a separate outlet opening, which are respectively connected to microfluidic channels upstream and downstream of the valve by respective connection channels, and wherein the connection channels are independently of each other arranged in angular position to the upper surface of the basic substrate. Stated differently, the surface area of the central recess comprises two openings, herein named inlet opening and outlet opening. The inlet opening connects the cavity of the central recess with a connection channel, which then connects to a microfluidic channel upstream of the valve, which is arranged in a different plane of the basic substrate than the upper surface thereof. The connection channel of the inlet opening is arranged in angular position to the upper surface of the basic substrate, i.e. is except of the connection with the central recess not arranged in the plane of the upper surface of the basic substrate. This configuration facilitates that the valve seat is arranged in a different plane than the microfluidic channel upstream of the microfluidic valve. Furthermore, the outlet opening connects the cavity of the central recess with another separate connection channel. The connection channel of the outlet opening is arranged independently from the connection channel of the inlet opening in angular position to the upper surface of the basic substrate. This configuration also facilitates that the valve seat is arranged in a different plane than the microfluidic channel downstream of the microfluidic valve. In summary, this inventive configuration allows that the inventive valve can be used irrespective of the arrangement and intersection angles between the microfluidic channels upstream and downstream of the inventive valve.

In general, the inlet and outlet openings and the respectively connected connection channels can have independently from each other any suitable surface area/cross section surface area. According to a preferred embodiment, the surface area of the inlet and/or outlet opening is the same as the cross section surface area of the respective connection channels in section of connection. More preferably, the surface area/cross section surface area is in the range of 0.008 mm² to 3.1 mm², preferably approximately 0.5 mm². Preferably, the connection channels are arranged as cylindrical or conical channels/holes in the basic substrate. Preferably, the diameter of a cylindrical or conical connection channel is in the range of 0.1 mm to 2 mm, more preferably between 0.3 mm and 1.2 mm.

According to an additional or alternative preferred embodiment of the present invention, in open valve state the valve cavity has a volume of $V_{VC} \leq 3*D^3$, wherein D is bigger of the hydraulic diameters of the inlet and outlet connection channels, wherein the hydraulic diameter D of a connection channel is defined as $D=4A/p$, where A is the cross-sectional area of the respective connection channel at inlet or outlet of the valve recess, respectively, and p is the cross-section perimeter. More preferably, $V_{VC} \leq 2$ µL and the inlet and outlet connection channels have a hydraulic diameter D in the range of 0.3 to 0.87 mm. In particular the elongate shape of the central recess in top view of the upper surface of the basic substrate further contributes to reduce the dead volume. Preferably, the longitudinal dimension of this central recess is more preferably just big enough to encompass the inlet opening, the outlet opening and the surface area of the basic substrate material between the inlet and outlet opening. In view of present injection molding requirements, the wall between the inlet and outlet opening and, thus, between the respective connection channels, has a thickness of at least 0.6 mm. The transverse dimension of this longitudinal recess can most preferably be made as small as to encompass the respective inlet and outlet openings and the surface area of basic material between them.

According to an additional or alternative preferred embodiment of the present invention, at least one, preferably both of the inlet and outlet openings are arranged in the part of the central recess with the largest distance $d_cR$. In other words, the part of the central recess with the largest distance $d_cR$ relates to the part of the central recess, which is in the lowest position of the central recess in operation. This in turn means, that in particular in case both of the inlet and outlet openings are arranged in the part of the central recess with the largest distance $d_cR$, i.e. at its lowest position during operation, the dead volume may be further reduced due to the gravitational flow of the liquid out of the central recess.

According to an additional or alternative preferred embodiment of the present invention, the lower surface of the top substrate and the upper surface of the elastomeric membrane can be flush-mounted, more preferably can be flush-mounted obtainable by two component injection molding. Thereby, the arrangements and relative positions between the elastomeric membrane and the top substrate remain. In this case, the invention furthermore simplifies the production process of the inventive valve/inventive microfluidic chip, as only a single substrate, comprising the elastomeric membrane and the top substrate, needs to be secured to the basic substrate for clenching the elastomeric part of the flush-mounted substrate.

All features and embodiments disclosed with respect to the first aspect of the present invention are combinable alone or in (sub-)combination with each of the second, third and fourth aspects of the present invention respectively including each of the preferred embodiments thereof, provided the resulting combination of features is reasonable.

According to the second aspect of the present invention, a microfluidic chip is provided comprising a microfluidic channel network and one or more of the microfluidic valves according to the first aspect of the present invention.

As already mentioned, the inventive microfluidic chip is in particular preferred in addition or alternative to other inventive embodiments, in case one elastomeric membrane covers two or more microfluidic valves. This configuration allows to simplify production of the inventive microfluidic chip and, thus, to reduce related production costs.

As an additional or alternative preferred embodiment of the present invention the microfluidic channels upstream and downstream of the respective one or more valves are arranged as respective recesses in the lower surface of the basic substrate respectively connected to the inlet and the outlet openings of the central recess by the separate connection channels, which are configured as separate through holes from the lower to the upper surface of the basic substrate, more preferably wherein the through holes are respectively arranged perpendicular to the upper surface of the basic substrate, and wherein the lower surface of the basic substrate is coated with a coating material thereby closing the recesses in the lower surface of the basic substrate and forming the respective microfluidic channels. This preferred embodiment further assists to use the inventive microfluidic valve irrespective of the arrangement of and the intersection angle between the microfluidic channels upstream and downstream of the inventive microfluidic valve(s). In turn, this means, that the microfluidic channels can be arranged in such a way as to optimize, i.e. reduce the space/surface area needed for the resulting microfluidic network to be connected by the inventive microfluidic valves.

According to the present invention suitable coating material can be used. More preferably, the coating material exhibits comparable properties as the basic substrate. Even more preferably, the coating material is of the same material as the basic substrate. Thus, according to an additional or alternative preferred embodiment of the second aspect of the present invention, the coating material is formed of a liquid and gas impermeable material selected from the group consisting of suitable glass and suitable polymers, wherein the polymers are preferably selected from the group consisting of polycarbonate, cyclic olefin copolymer, polystyrene, cyclic olefin polymer or poly(methyl methacrylate). More preferably, the coating material is selected from polycarbonate.

The coating material is generally applied in liquid tight and gas tight manner to the lower surface of the basic substrate thereby forming the microfluidic channels upstream and downstream of an inventive valve and in case of two or more valves a microfluidic network. The coating material is preferably applied in form of a foil or plate, which is used in a suitable thickness in order to be bonded/sealed in gas and liquid impermeable manner to the basic substrate. The applied coating material, preferably foil or plate is generally configured to withstand the overpressure, which builds up during operation, preferably the applied coating material, preferably foil or plate maintains the unvented microfluidic network when subjected to an overpressure of 5 bar, preferably 10 bar.

According to a further additional or alternative preferred embodiment of the present invention, the basic substrate comprises on its upper surface outside of the valve seat, preferably outside the perimeter $p_{Po}$ of the projection, one or more clenching projections with a distance $d_{CP}>d$ from the upper surface of the basic substrate to the upper surface of the clenching projection measured perpendicular to upper surface plane of the basic substrate, and wherein the elastomeric membrane and the top substrate respectively comprise in register to the one or more clenching projections one or more recesses, preferably one or more through holes configured to fit with the one or more clenching projections. Such clenching projections may have a suitable height (distance $d_{CP}$) in order to facilitate clenching. The one or more clenching projections are preferably made of the same substrate as the basic substrate and are in the part, which is in contact with the top substrate, deformable. Preferably, the one or more clenching projections are deformable by applying suitable treatments, such as thermal treatment and/or solvent treatment, more preferably thermal treatment.

According to a further additional or alternative preferred embodiment of the present invention, the distance $d_{CP}$ of one or more of the clenching projections prior to securing the elastomeric membrane and top substrate to the basic substrate is bigger than the distance $d_{BTLS}$ from the upper surface of basic substrate to the lower surface plane of the top substrate measured perpendicular to the lower surface plane of the top substrate with $d_{CP}>d_{BTLS}$, preferably wherein $d_{CP}$ is in addition smaller than the distance $d_{BTLS}$ from the upper surface of basic substrate to the upper surface plane of the top substrate measured perpendicular to the upper surface plane of the top substrate with $d_{BTUS}>d_{CP}>d_{BTLS}$, and wherein the clenching projections are deformed in part after positioning the elastomeric membrane and top substrate in order to clench the elastomeric membrane in between the upper surface of the basic substrate and lower surface of the top substrate.

According to a further additional or alternative preferred embodiment of the present invention, the basic substrate comprises on its upper surface outside of the valve seat, preferably outside the perimeter $p_{Po}$ of the projection, one or more spacer projections with a distance $d_{SP}$ from the upper surface of the basic substrate to the upper surface of the spacer projection measured perpendicular to the upper surface plane of the basic substrate with $d_{SP} \geq d$, wherein the elastomeric membrane comprises in register to the one or more spacer projections respective one or more through holes arranged perpendicular to the lower surface of the top substrate, and wherein the top substrate does not comprise in register to the one or more spacer projections respective one or more counterpart recesses or through holes arranged perpendicular to the lower surface of the top substrate. The one or more spacer projections are preferably made of the same substrate as the basic substrate. The one or more spacer projections are preferably configured to prevent the elastomeric membrane from being deformed in the area outside the outer perimeter of the projection $p_{Po}$, or excessively deformed between the perimeter $p_{CR}$ and the perimeter $pp_o$, when the clenching projections are deformed. Furthermore, preferably two, three or more spacer projections per inventive microfluidic chip are used to facilitate even levelling of the top substrate in relation to the basic substrate.

All features and embodiments disclosed with respect to the second aspect of the present invention are combinable alone or in (sub-)combination with each of the first, third and fourth aspects of the present invention respectively including each of the preferred embodiments thereof, provided the resulting combination of features is reasonable.

According to the third aspect of the present invention, a process for producing the inventive microfluidic valve or the inventive microfluidic chip is provided, characterized in that the process comprises or consists of the following steps:

a. Providing a basic substrate, an elastomeric membrane and a top substrate as respectively defined with respect to any one of first and/or second aspects of the present invention, and b. Arranging the lower surface of the elastomeric membrane on the upper surface of the basic substrate and arranging the lower surface of the top substrate on the upper surface of the elastomeric membrane, thereby arranging the through hole of the top substrate having a perimeter $p_{TH} \leq p_{Pi}$ in register to the perimeter of the valve seat, c. Securing the top substrate to the basic substrate thereby clenching the elastomeric membrane to the basic substrate in such a way that the valve seat is sealed in upper direction, whereby the elastomeric membrane is configured to not be in contact with the surface of the central recess in open valve state thereby forming a valve cavity, which connects the connection channels upstream and downstream of the valve, and to be deformable by a valve actuator means so that in closed valve state the elastomeric membrane closes fluidic connection between the inlet and outlet openings in the central recess.

The inventive production process is in particular preferred, as the elastomeric membrane can have the same configuration over the whole surface area, and, thus, allows a greater freedom of arranging the elastomeric membrane in relation to the basic substrate and/or the top substrate. Furthermore, no additional elastic membrane needs to be used in order to achieve controlling flow of liquid in a microfluidic channel. Even more preferably, the present inventive production process can avoid an adhesive for sealing the valve seat with the elastic membrane in upper direction.

Accordingly, the inventive production process allows for a simple and cost effective assembly of the inventive microfluidic valve and the inventive microfluidic chip of the first and second inventive aspects.

The basic substrate and top substrate as defined with respect to the first aspect of the present invention, is obtainable by any suitable technique, such as an injection molding process. In case the top substrate and the elastomeric membrane shall be provided as one flush-mounted substrate, a suitable production process is chosen, such as a two component injection molding process. The further characteristics and properties of the basic substrate are in particular disclosed with respect to the first or second inventive aspect.

The basic substrate, the elastic membrane and top substrate are arranged/assembled in this adjacent order with suitable processes in process step b), preferably automated processes.

In addition, the securing step c) is also conducted with suitable securing means. According to an additional or alternative preferred embodiment of the present invention, the basic substrate is secured to the top substrate with one or more of its clenching projections. According to this preferred embodiment, the clenching projections are preferably deformed only in the part thereof, which extends the lower surface of the top substrate in order to clench the elastomeric membrane to the basic substrate in such a way that the valve seat is sealed in upper direction, whereby the elastomeric membrane is configured to not be in contact with the surface of the central recess in open valve state thereby forming a valve cavity, which connects the connection channels upstream and downstream of the valve, and to be deformable by a valve actuator means so that in closed valve state the elastomeric membrane closes fluidic connection between the inlet and outlet openings in the central recess. According to a further preferred embodiment, the one or more clenching projections are deformable by suitable treatments, such as thermal and/or solvent treatment.

According to an additional or alternative preferred embodiment of the present invention, the top substrate is positioned in such a way that it is in contact with one, preferably two, three, four or more spacer projections of the basic substrate in order to facilitate even levelling of the top substrate in relation to the basic substrate. Even more preferred is this embodiment, in case the spacer projections are configured to be not deformable during the deformation treatment of the clenching projections.

All features and embodiments disclosed with respect to the third aspect of the present invention are combinable alone or in (sub-)combination with each of the first, second and fourth aspects of the present invention respectively including each of the preferred embodiments thereof, provided the resulting combination of features is reasonable.

According to the fourth aspect of the present invention, a use of the microfluidic valve according to first inventive aspect or a microfluidic chip according to the second aspect of the present invention or a microfluidic chip obtainable according to the third inventive aspect is provided for controlling flow of a liquid composition in a microfluidic channel of a microfluidic channel network.

As already set out previously, the inventive use of the microfluidic valve according to first inventive aspect or the microfluidic chip according to the second aspect of the present invention or the microfluidic chip obtainable according to the third inventive aspect facilitates controlling liquid flow in a microfluidic channel wherein the microfluidic valve can be used for controlling liquid flow in microfluidic channels irrespective of the applicable intersection angle between the microfluidic channels to be connected/disconnected and wherein the same valve actuator means can be used for operating the microfluidic valve, and wherein the valve actuator only needs to fit within the perimeter prH of the through hole of the top substrate in register with the valve seat of the basic substrate, and wherein the dead volume of the microfluidic valve is optimized, more preferably reduced, and wherein any suitable valve actuator can be used, provided it fits within the perimeter prH of the through hole in the top substrate in register with the valve seat of the basic substrate, and wherein the production process of the microfluidic valve is simple and cost effective.

All features and embodiments disclosed with respect to the fourth aspect of the present invention are combinable alone or in (sub-)combination with each of the first, second and third aspects of the present invention respectively including each of the preferred embodiments thereof, provided the resulting combination of features is reasonable.

DETAILED DESCRIPTION OF THE FIGURES

Further characteristics and advantages of the present invention will ensue from the following description of embodiments of the inventive aspects with reference to the accompanying drawings.

The microfluidic valve as disclosed in the accompanying drawings relates to an inventive microfluidic valve in particular a microfluidic chip comprising as an example two inventive microfluidic valves in particular for controlling liquid flow in microfluidic chips to be used, e.g., for isolation of nucleic acid, even more preferably for isolation of the nucleic acid and subsequently carrying out a PCR analysis. Although the inventive microfluidic valve and chip is in the following described in this configuration, other configurations encompassed by the present invention and in particular by the claimed subject matter are not limited by the following exemplary description.

Dimensions, such as distances, volumes, concentrations, ratios and hardness properties provided in the context of the present invention, in particular in the following description shall comprise suitable deviations in the art respectively applicable to the respective dimensions and/applications of the present invention. The illustrated embodiments are, however, in particular not limited to the actual dimensions given, but can have other suitable ranges of dimensions as described in the general description hereinbefore.

FIG. 1A represents a simplified top view of a part of an inventive microfluidic valve 1 and chip 10 with cross section plane B-B. FIG. 1A, thus, shows the arrangement in top view of the basic substrate 11 the valve seat 111, the perimeter of the valve seat $p_V$, the central recess of the valve seat 112, the perimeter of the central recess $p_{CR}$, the inlet opening of the central recess 1121, the outlet opening of the central recess 1122 and the projection 113 together with its inner perimeter $p_{Pi}$ and its outer perimeter $p_{Po}$. As shown in FIG. 1A, the central recess has a longitudinal shape and optimized dimensions in longitudinal and transverse direction thereof in order to reduce the dead volume of the valve cavity.

The perimeter of the valve seat $p_V$ can preferably range between 1 mm to 25 mm, preferably between 10 mm and 16 mm. Presently, $p_V$ is 13 mm.

The perimeter of the central recess $p_{CR}$ can preferably range between 600 µm to 12.5 mm, preferably between 5 mm and 10 mm. Presently, $p_{CR}$ is 7.5 mm.

The inner perimeter $p_{Pi}$ of the projection can preferably range between 1 mm to 25 mm, preferably between 10 mm and 16 mm. Presently, $p_{Pi}$ is 13 mm, whereas the outer perimeter $p_{Po}$ of the projection can preferably range between 1.5 mm to 40 mm, preferably between 15 mm and 30 mm. Presently, $p_{Po}$ is 22 mm.

The inlet opening of the central recess 1121 and the outlet opening of the central recess 1122 preferably have the same surface and, more preferably have an elliptical surface area which results from the intersection of the cylindrical or conical connection channel $CC_i$ or $CC_o$, having a hydraulic diameter D in the range between 0.1 mm to 2 mm, preferably between 0.3 mm and 1.2 mm, with the surface of the central recess. Presently, the hydraulic diameter D of the inlet and/or outlet connection channels $CC_i$ or $CC_o$ is in the range of 760 µm to 800 µm.

The microfluidic channel $MC_{UP}$ arranged upstream of the inventive microfluidic valve 1 and the microfluidic channel $MC_{DOWN}$ arranged downstream of the inventive microfluidic valve 1 are disclosed in dotted lines, as they are arranged on the lower surface of the basic substrate 11. In general, the cross section dimension of the microfluidic channels $MC_{UP}$ and $MC_{DOWN}$ perpendicular to the direction of flow is of suitable dimension, preferably it is in the range of 100 µm to 2 mm, more preferably 300 µm to 1.2 mm, wherein the cross section dimension is the diameter of a circular cross section, is the side length of a square cross section or is the side length of the longer side of a rectangular cross section. In the present case, the cross section dimension is approximately 800 µm.

In addition, FIG. 1A discloses the four clenching projections CP and four spacer projections SP arranged respectively symmetrically around the inventive microfluidic valve 1. As can also be seen from FIG. 1A one spacer projection SP may exhibit a larger diameter than the other spacer projections. In this case positioning of the elastomeric membrane may be simplified, in case positioning of the elastomeric membrane is relevant in terms of other requirements not relating to the inventive microfluidic valve. With respect to the present embodiment, such a difference of diameters of spacer and/or clenching projections is not necessary.

The material of the basic substrate 11 generally facilitates to inventive microfluidic valve and is accordingly formed of a suitable liquid and gas impermeable material, as set out in more detail in the general description hereinbefore. In the present case, polycarbonate, in particular with high viscosity is used for the basic substrate 11.

Figure 1B:
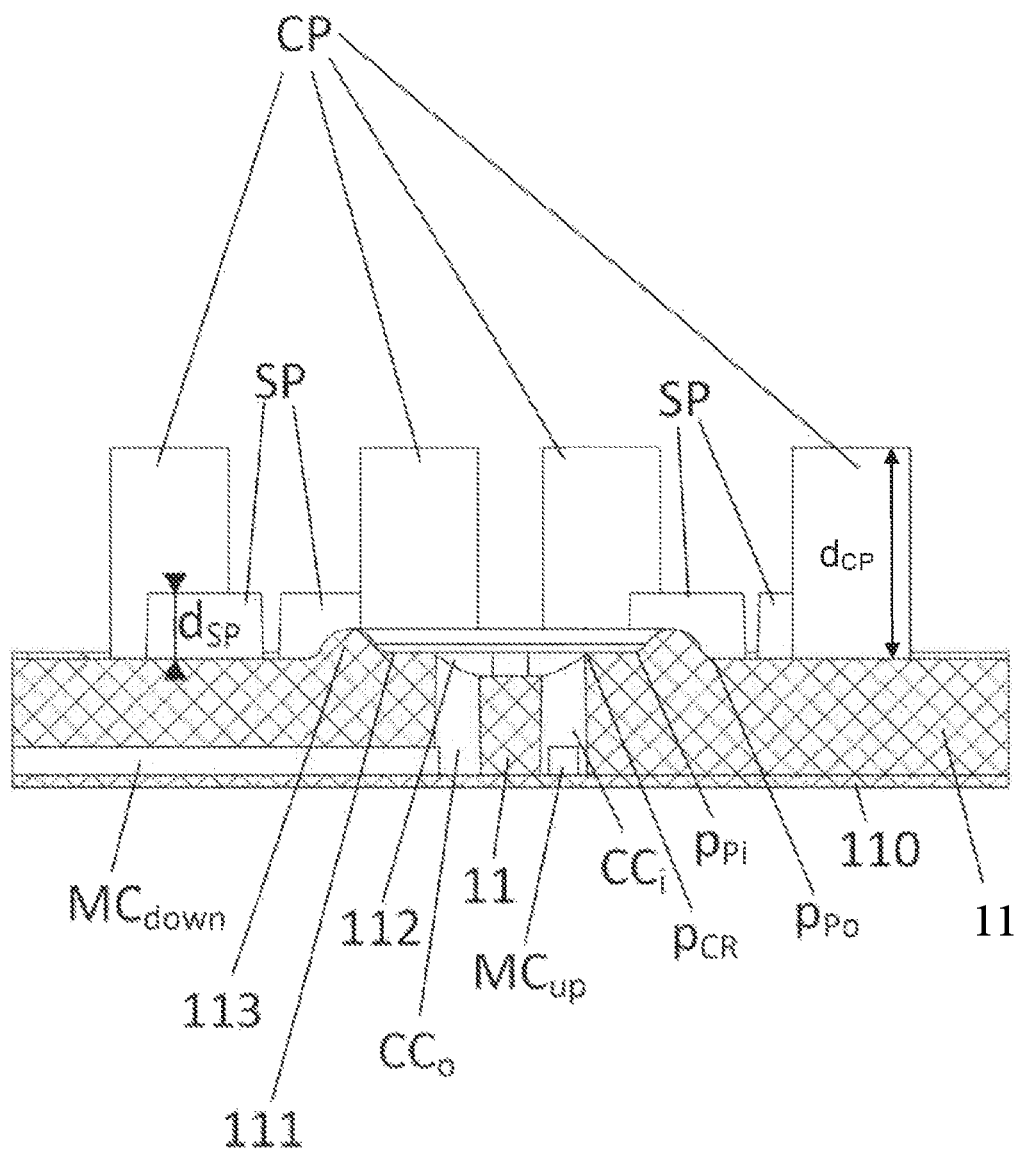
FIG. 1B represents a simplified cross section side view in plane B-B of part of a basic substrate of an inventive microfluidic valve.

According to FIG. 1B a simplified cross section side view in plane B-B of part of a basic substrate 11 of an inventive microfluidic valve 1 is shown, which comprises a coating material 110, which is coated to the lower surface of the basic substrate 11 and, thus, providing the microfluidic channel upstream $MC_{UP}$ and the microfluidic channel downstream $MC_{DOWN}$ (only the inlet into $MC_{DOWN}$ is shown) of the inventive valve. FIG. 1B does not show an elastomeric membrane 12 or a top substrate 13 assembled to the basic substrate in order to increase visibility of the cross section B-B arrangement of the inventive microfluidic valve 1.

Furthermore, from FIG. 1B it is apparent that the intersection angle a between the axis of the microfluidic channel upstream $MC_{UP}$ and the connected connection channel $CC_i$, which is arranged perpendicular to the microfluidic channel upstream $MC_{UP}$, is approximately 90°. The connection cannel $CC_i$ is connected in direction of flow with the inlet opening 1121 of the central recess 112 having a perimeter $p_{CR}$. The central recess 112 is arranged in the center of the valve seat 111 surrounded by the projection 113 having an inner perimeter $p_{Pi}$ and an outer perimeter $p_{Po}$. The central recess furthermore comprises an outlet opening connected to the connection channel $CC_o$, which connects to the microfluidic channel downstream of the inventive microfluidic valve 1.

According to the present invention, the connection channels $CC_i$ and $CC_o$ exhibit preferably the same geometry, preferably in form of a cylindrical or conical shape. The conical shape may advance expelling the basic substrate from a mold after injection molding. In case the connection channel forms a cylinder the diameter of the base surface may preferably range from 0.3 to 1.2 mm, and is presently 0.8 mm and a height of approximately 2 mm. In case the form is conical, one of the base surfaces, preferably the surface arranged in the upper plane, may preferably range from 0.3 to 1.2 mm and is approximately 0.8 mm in diameter with an of inclination approximately 1°, so that the opposite surface of the basic substrate shows a respectively smaller diameter and wherein the height of the conical shape is approximately 2 mm.

In addition, FIG. 1B shows four clenching projections CP arranged outside of the projection 113 as well as four spacer projections SP respectively arranged on the upper surface of the basic substrate 11 in symmetric order. Alternatively, an asymmetric order can be chosen. The clenching projections CP respectively have the same height, namely the distance $d_{CR}$ from the upper surface of the basic substrate 11 to the upper surface of the clenching projection CP measured perpendicular to upper surface plane of the basic substrate 11. Alternatively, the clenching projections CP may respectively have different dimensions.

In addition FIG. 1B shows that the spacer projections SP have the same height, namely the distance $d_{SP}$ from the upper surface of the basic substrate 11 to the upper surface of the spacer projection SP measured perpendicular to upper surface plane of the basic substrate 11. Alternatively, the spacer projections SP may respectively have different dimensions.

The thickness of the basic substrate 11 measured perpendicular to the lower and upper surface plane can generally range from 300 µm to 10 mm, and preferably is in the range of 500 µm to 5 mm, most preferably between 1 mm and 3 mm. The distance $d_{SP}$ (height) of the spacer projection SP is presently 1.1 mm and the distance $d_{CP}$ (height) of the clenching projection CP is presently 3.6 mm.

Figure 2A:
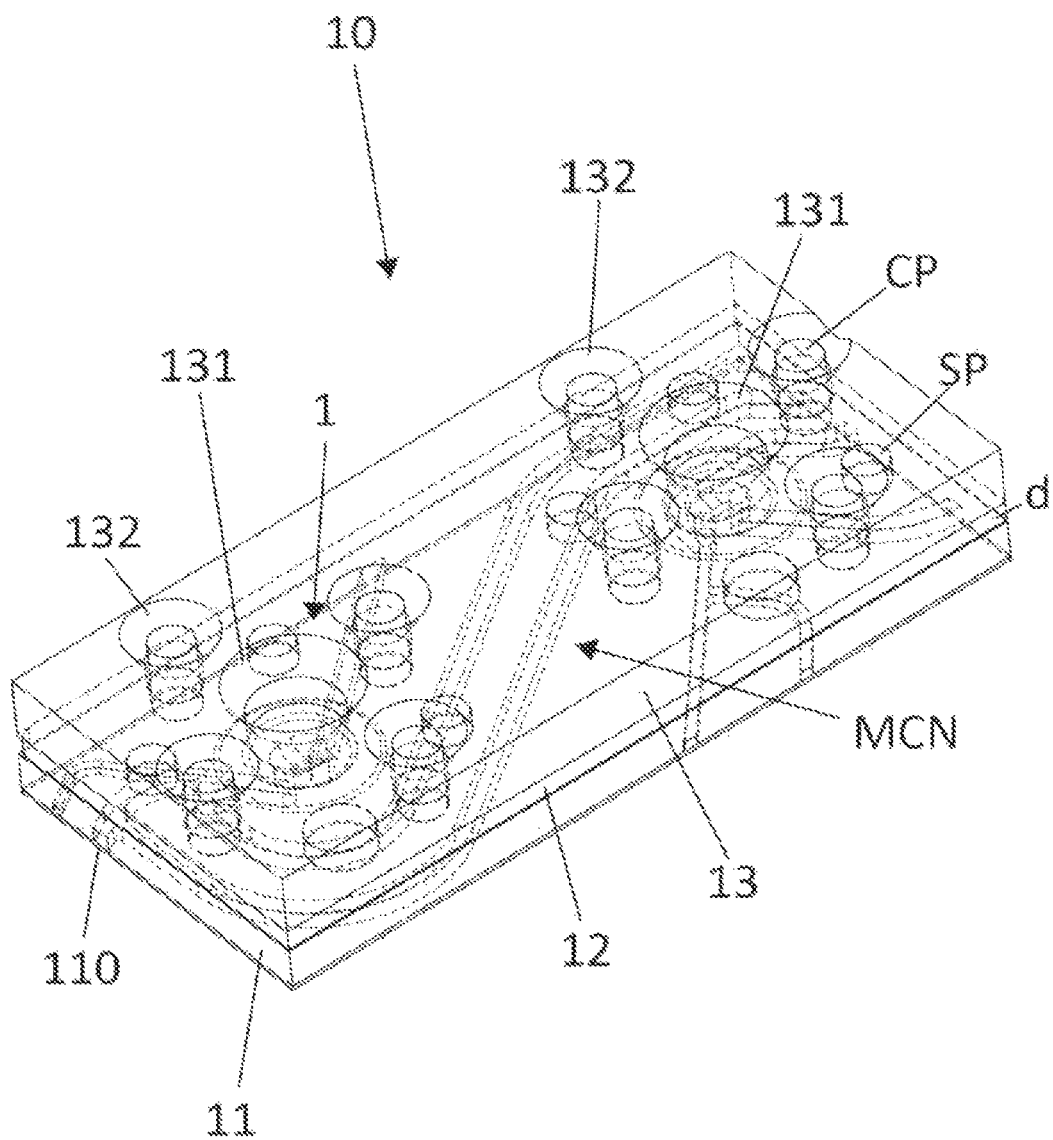
FIG. 2A represents a simplified perspective top view of a part of an inventive microfluidic chip comprising two inventive microfluidic valves prior to securing.
Figure 2B:
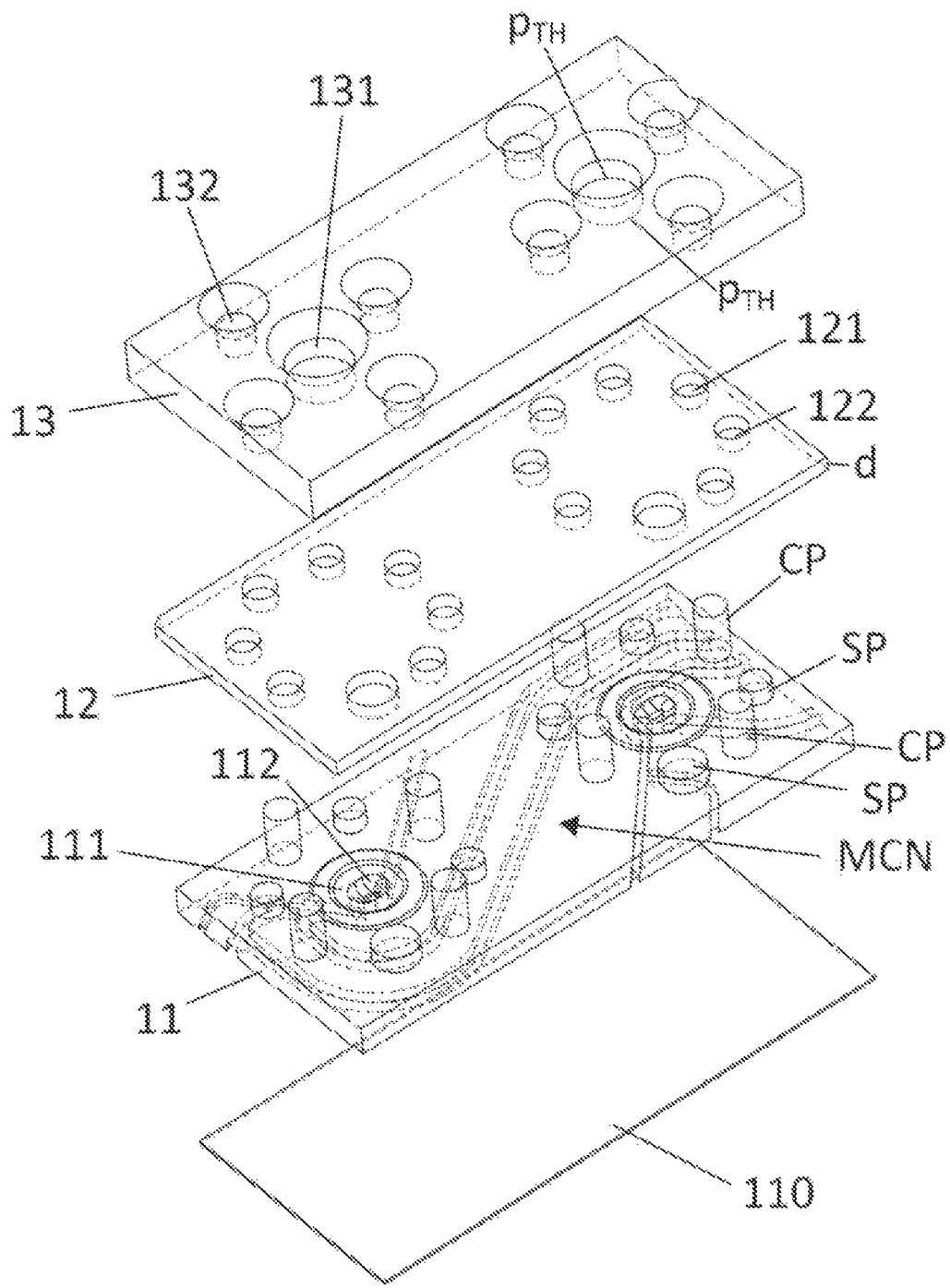
FIG. 2B represents a simplified perspective top view of a part of an inventive microfluidic chip comprising two inventive microfluidic valves prior to assembly.

FIGS. 2A and 2B represents a simplified perspective top view of a part of an inventive microfluidic chip 10 comprising two inventive microfluidic valves 1, wherein in FIG. 2B the respective parts of basic substrate 11 with bonded coating material 110, elastomeric membrane 12 and top substrate 13 are shown in the same order, but expanded/spaced from each other. In both FIGS. 2A and 2B the clenching projections are not deformed to secure the top substrate 13 to the basic substrate 11 thereby not securing the elastomeric membrane 12 in such a way that the elastomeric membrane 12 is clenched between the upper surface of the basic substrate 11 and the lower surface of the top substrate 13.

According to FIGS. 2A and 2B, the upper surface of the basic substrate 11 is in direct connection with the lower surface of the elastomeric membrane 12 and the upper surface of the elastomeric membrane 12 in relaxed state with a thickness $d_{EM}=d$ is in contact with the lower surface of the top substrate 13. The thickness $d_{EM}$ is in the present case 1 mm. The basic substrate comprises the microfluidic channel network MCN (shown in dotted lines) as respective recesses in the lower surface of the basic substrate. The coating material 110 is bonded to the lower surface of the basic substrate 11 in order to produce the microfluidic channel network MCN. In addition FIGS. 2A and 2B show the arrangement of the through hole 131 with a perimeter $p_{TH}$ of the top substrate 13 in register with the valve seat 111. The through hole 131 preferably has a cylindrical or conical shape. More preferably a cylindrical shape is combined with a conical shape, wherein the cylindrical shape expands from the lower surface of the top substrate 13 perpendicular to the lower surface plane in direction to the upper surface and at a certain dimension the cylindrical shape connects to a conical shape, wherein the conical shape opens up in direction to the upper surface of the top substrate 13, more preferably has an angle of >5°, preferably of >20°, more preferably >50° and presently is 60°. The diameter of the circular base section of the conical shape on the upper surface of the top substrate 13 is smaller than the perimeter $p_{Pi}$ and bigger than the perimeter $p_{CR}$ of the central recess. Thus, the diameter of the through hole 131 can preferably range between the transverse dimension of the central recess to the diameter of the inner perimeter of the projection $p_{Pi}$, more preferably between the longitudinal dimension of the central recess and the diameter of the inner perimeter of the projection $p_{Pi}$.

According to the present example, the diameter of the through hole 131 in cylindrical form is approximately 0.4 mm and the height of the cylindrical form is approximately 1.5 mm, whereas the conical form has the same diameter as the cylindrical form at its connection point and opens up in direction to the upper surface of the top substrate 13 such that the diameter is approximately 5.5 mm at the upper surface of the top substrate 13. The height of the conical form is approximately 1.5 mm. Such an arrangement is in particular advantageous for arranging the valve actuator means 2 (shown in FIGS. 2D and 2E) easily within the through hole. The valve actuator may also be positioned slightly outside of the perimeter prH of the through hole at the lower surface of the top substrate 13. While being lowered to close the valve 1 from such a position the conical shape of the through hole 131 can facilitate to correctly arrange the dispositioned valve actuator means 2, as it can smoothly slide down the slope of the through hole 131 in order to close the valve 1. In contrast thereto, using only a cylindrical form for the through hole 131, the valve actuator means 2 in case of being dispositioned could catch on the edge of the through hole 131 of the top substrate 13 and, thus, could break. Thus, the conical shape of the through hole is preferred, as it may prevent damage of either the microfluidic chip and/or the valve actuator means 2 and enables proper operation with enlarged tolerance for positioning the valve actuator means 2.

The top substrate 13 may have preferably thickness measured perpendicular to its lower and upper surface plane in the range of 0.5 mm to 10 mm, more preferably between 1 and 5 mm. In the present case the top substrate has a thickness of approximately 3 mm.

Furthermore, FIGS. 2A and 2B show the clenching projections CP and respective through holes 121 of the elastomeric membrane 12 and 132 of the top substrate 13. The through hole 132 preferably has a cylindrical or conical shape. More preferably, a cylindrical shape is combined with a conical shape, wherein the cylindrical shape expands from the lower surface of the top substrate 13 perpendicular to the lower surface plane in direction to the upper surface and at a certain dimension the cylindrical shape connects to a conical shape, wherein the conical shape opens up in direction to the upper surface of the top substrate 13, more preferably has an angle of >5°, preferably of >20°, more preferably >50° and presently is 60° respectively relating to the axis of the through hole 132. According to the present example, the diameter of the cylindrical form is approximately 0.4 mm and the height of the cylindrical form is approximately 1.5 mm, whereas the conical form has the same diameter as the cylindrical form at its connection point and opens up in direction to the upper surface of the top substrate 13 such that the diameter is approximately 5.5 mm at the upper surface of the top substrate 13. The height of the conical form is approximately 1.5 mm. Such an arrangement is in particular advantageous for in case the respective clenching projection CP is deformed in order to secure the top substrate 13 to the basic substrate 11 thereby clenching the elastomeric membrane 12 between the upper surface of the basic substrate 11 and the lower surface of the top substrate 13. In view of thermal treatments, the clenching projection CP may be deformed to produce a so-called mushroom like head. The mushroom like head of the clenching projection CP may be arranged in the conical part of the through hole 132 and, thus, may protect the top substrate from changing its position. Due to the enlarged volume of the through hole 132, the deformed part of the clenching projection CP may be positioned inside of the through hole 132 and does not exceed the thickness of the top substrate.

Figure 2C:
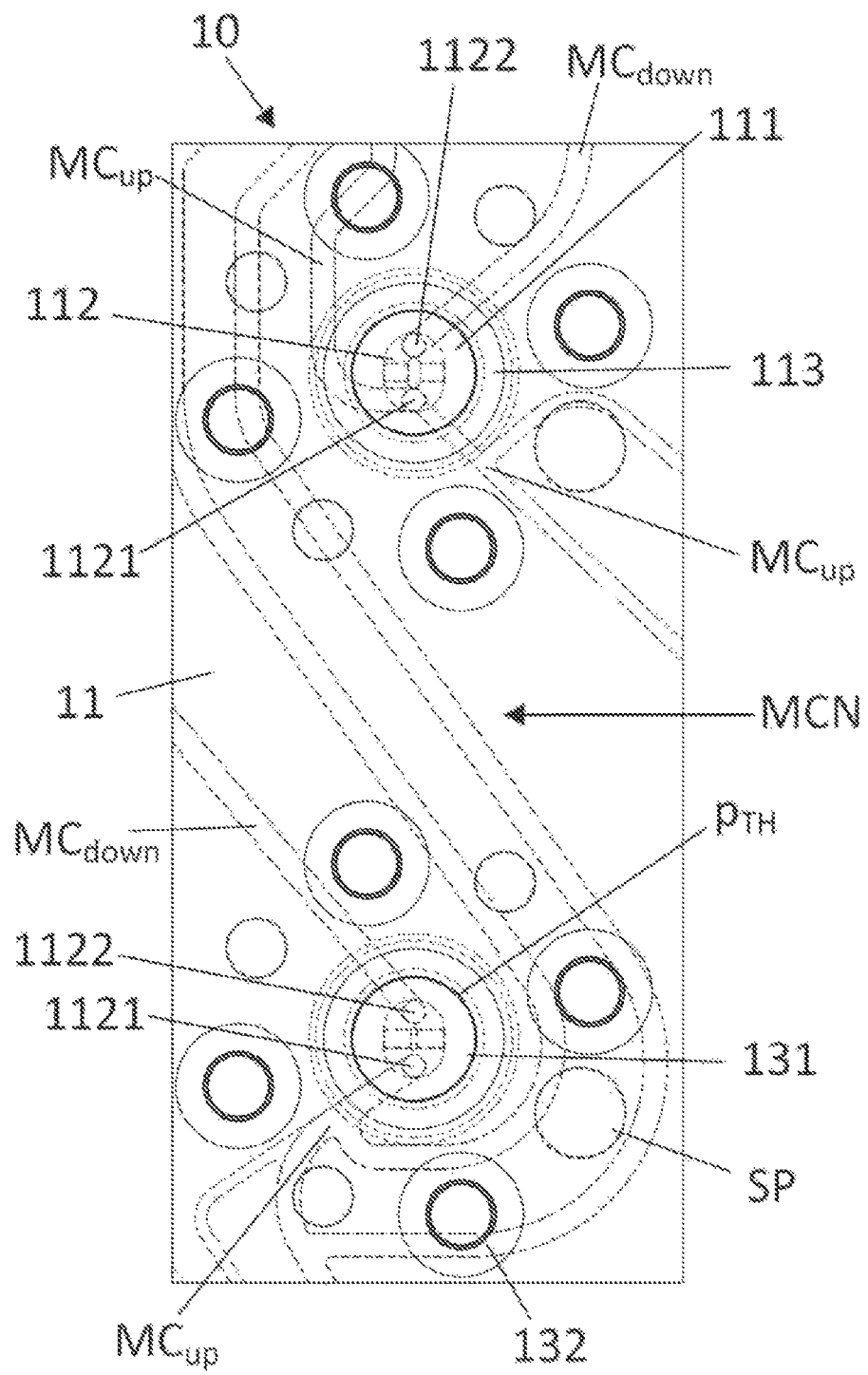
FIG. 2C represents a simplified top view of a part of an inventive microfluidic chip comprising two inventive microfluidic valves.

FIG. 2C represents a simplified top view of a part of an inventive microfluidic chip 10 comprising two inventive microfluidic valves 1 respectively with valve seat 111, central recess 112, and projection 113 surrounding the valve seat 111. The central recesses respectively comprise an inlet opening 1121 and an outlet opening 1122 respectively connected to connection channels $C_i$ and $CC_o$. The connection channel $CC_i$ connected to the microfluidic channel upstream $MC_{UP}$ the valve, whereas the connection channel $CC_o$ connects to the microfluidic channel downstream $MC_{DOWN}$ of the valve. As can be seen from FIG. 2C, the microfluidic channels $MC_{UP}$ and $MC_{DOWN}$ have different intersection angles in the plane of the lower surface of the basic substrate. Nevertheless, the same inventive valve can be used, because the microfluidic channels $MC_{UP}$ and $MC_{DOWN}$ and in particular the microfluidic channel network MCN as such is arranged as respective recesses on the lower surface of the basic substrate 11. In addition, FIG. 2C shows the arrangement of the through hole 131 with a perimeter prH of the top substrate 13 as well as the four clenching projections CP and four spacer projections respectively surrounding the projection 113 of each microfluidic valve 1.

Figure 2D:
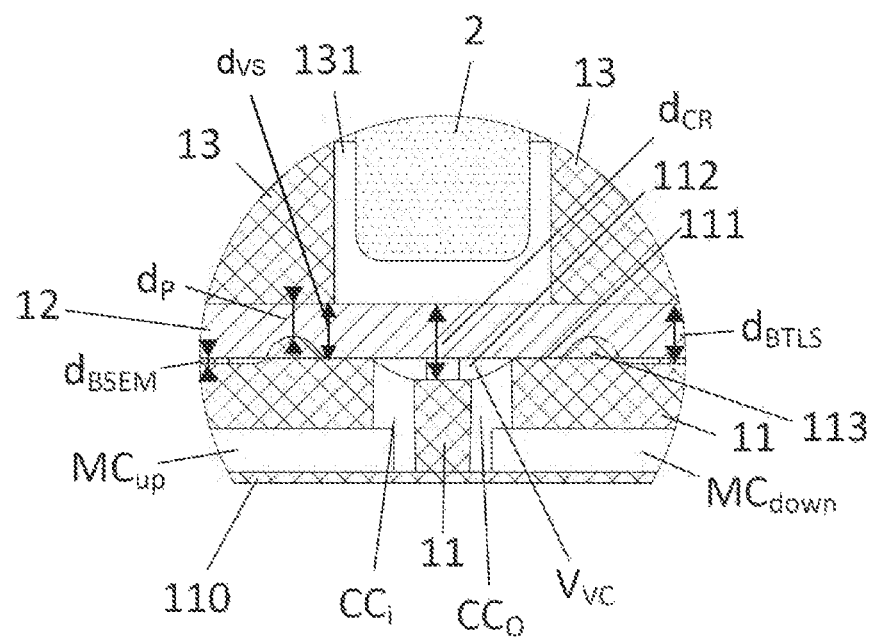
FIG. 2D represents a simplified cross section side view of an extracted part of an assembled microfluidic chip in open valve state and corresponding valve actuator means.
Figure 2E:
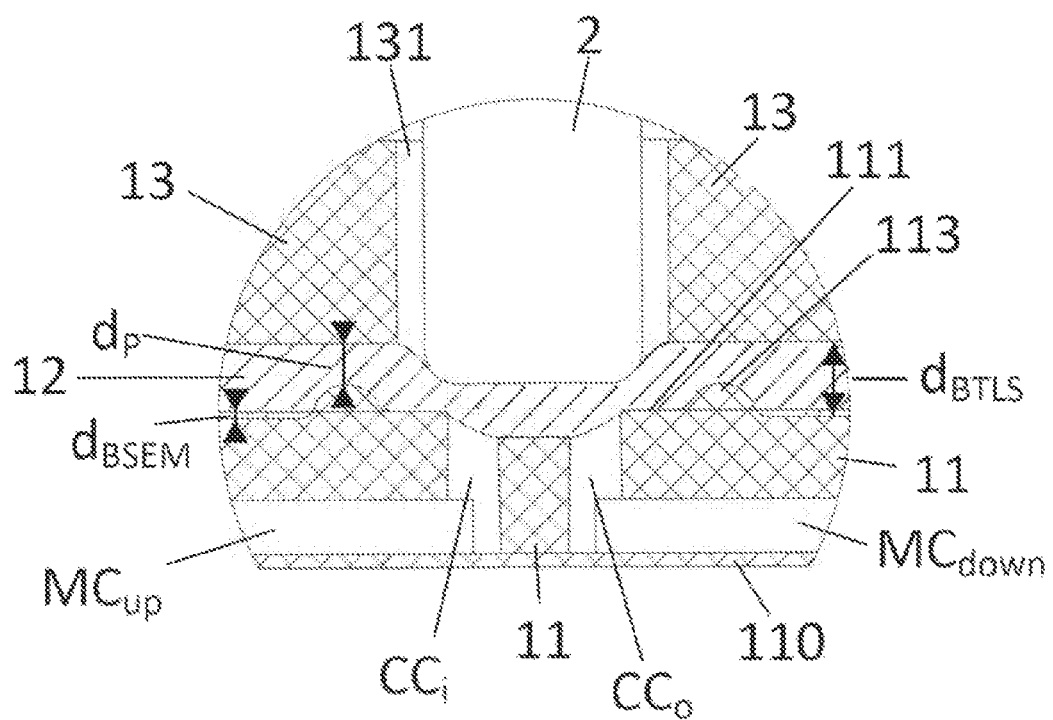
FIG. 2E represents a simplified cross section side view of an extracted part of an assembled microfluidic chip and corresponding valve actuator means in closed valve state.

FIGS. 2D and 2E respectively represent a simplified cross section side view of an extracted part of an assembled microfluidic chip 10 in open and closed valve state as well as part of a corresponding valve actuator means 2. The cross section is in a similar plane than B-B, however, for another arrangement of microfluidic channels upstream and downstream of the valve.

Accordingly, FIGS. 2D and 2E respectively show a basic substrate 11 as well as a coating material 110, preferably a foil or plate, bonded to the basic substrate in order to provide the microfluidic channel upstream and downstream $MC_{UP}$ and $MC_{DOWN}$ of the inventive valve 1, which are respectively arranged as recesses in the lower surface of the basic substrate.

Moreover, FIGS. 2D and 2E respectively show a connection channel $CC_i$ and a connection channel $CC_o$ respectively connected to the microfluidic channel upstream and downstream $MC_{UP}$ and $MC_{DOWN}$ of the inventive valve 1, wherein the connection channels $CC_i$ and $CC_o$ respectively connect to the inlet opening 1121 and outlet opening 1122 of the central recess 112 of the valve seat 111. The valve seat 111 is surrounded by a projection 113.

In addition, FIGS. 2D and 2E respectively show that the elastomeric membrane 12 is clenched between the upper surface of the basic substrate 11 and the lower surface of the top substrate 13. The top substrate 13 exhibits a through hole 131 into which the valve actuator means 2, preferably in form of a rod-like pin, is centrally arranged. As can be seen from FIGS. 2D and 2E respectively, the valve actuator means 2 has a bigger cross section than the cross section of the central recess 112.

FIGS. 2D and 2E furthermore respectively show that the elastomeric membrane 12 outside of the projection 13 is preferably not in contact with the upper surface of the basic substrate 11, in particular shows a distance $d_{BSEM}$ from the upper surface of the basic substrate to the lower surface of the elastomeric membrane measured perpendicular to the upper surface of the basic substrate. The distance $d_{BSEM}$ may be of any suitable dimension, preferably may range from 0 to 200 µm, preferably, 100 µm. In the present case, the distance $d_{BSEM}$ is approximately 0.1 mm. Such an arrangement is preferred, as less pressure is applied to the basic substrate 11, which reduces in turn the wear of the basic substrate, in particular in case in the microfluidic channel network MCN an overpressure builds up during operation.

Furthermore, FIGS. 2D and/or 2E show respective distances between the upper surface of the basic substrate and the lower surface plane of the top substrate measured perpendicular to the lower surface plane as set out in the following:

Distance $d_{BTLS}$ between the upper surface of the basic substrate and the lower surface plane of the top substrate measured perpendicular to the lower surface plane outside the perimeter $p_{Po}$ of the projection can generally range from d to d+200 µm, preferably d+100 µm. In the present case, distance $d_{BTLS}$ is approximately 1.1 mm.

Distance $d_{VS}$ between the upper surface of the basic substrate to the lower surface plane of the top substrate measured perpendicular to the lower surface plane in the valve seat surface area between the perimeters $p_{CR}<p_V$ and $p_V=p_{Pi}$ projection can generally range from d+20 µm to d−100 µm, preferably is approximately d. In the present case, distance $d_{VS}$ is approximately 1 mm.

Distance $d_{CR}$ between the upper surface of the basic substrate and the lower surface plane of the top substrate measured perpendicular to the lower surface plane within the perimeter $p_{CR}$ of the central recess can generally range from d+100 µm to d+800 µm, preferably d+400 µm. In the present case, distance $d_{CR}$ is approximately 1.4 mm.

Distance $d_P$ between the upper surface of the basic substrate and the lower surface plane of the top substrate measured perpendicular to the lower surface plane within the perimeters $p_{Pi}$ and $p_{Po}$ of the projection can generally range from 0.3*d to 0.65*d, preferably 0.6*d. In the present case, distance $d_P$ is approximately 0.6 mm.

As already mentioned above, FIG. 2D shows an open valve state of an inventive valve, wherein the lower surface of the elastomeric membrane 12 is in contact with the upper surface of the basic substrate in the area of the valve seat 111 within the projection 113, but outside of the central recess 112, thus, forming a valve cavity with volume $V_{VC}$ in the area of the central recess 112. The valve cavity facilitates fluidic flow from the connection channel $CC_i$ to connection channel $CC_o$. The volume of the valve cavity has preferably a volume of $V_{VC} \leq 3*D^3$, wherein D is bigger of the hydraulic diameters of the inlet and outlet connection channels $CC_i$ and $CC_o$ wherein the hydraulic diameter D of a connection channel is defined as D=4A/p, where A is the cross-sectional area of the respective connection channel at inlet or outlet of the valve recess, respectively, and p is the cross-section perimeter. More preferably, $V_{VC} \leq 2$ µL and the inlet and outlet connection channels have a hydraulic diameter D in the range of 0.3 to 0.87 mm. In the present case the volume of $V_{VC}$ is 1.13 µL.

In contrast thereto, FIG. 2E shows a closed valve state of an inventive valve, wherein the valve actuator is now arranged to deform the elastomeric membrane 12 within the area of the valve seat 111. Thus, the elastomeric membrane 12 is deformed and can be at least partially compressed. Thereby, the elastomeric membrane 12 additionally fills at least partially the volume $V_{VC}$ in the former valve cavity within the central recess thereby stopping fluidic flow from the connection channel $CC_i$ to connection channel $CC_o$.

All of the features disclosed with respect to the accompanying figures can alone or in any sub-combination be combined with features of the three aspects of the present invention including features of preferred embodiments thereof, provided the resulting feature combination is reasonable to a person skilled in the art.

REFERENCE NUMERALS

1 Inventive microfluidic valve
10 Inventive microfluidic chip
11 basic substrate
110 coating material
111 valve seat
$p_V$ perimeter of valve seat
112 central recess of valve seat
$p_{CR}$ perimeter of central recess
1121 inlet opening of central recess
$CC_i$ connection channel connected to inlet opening
1122 outlet opening of central recess
$CC_o$ connection channel connected to inlet opening
$V_{VC}$ volume of valve cavity formed by central recess in open valve state
113 projection surrounding the valve seat
$p_{Pi}$ inner perimeter of projection
$p_{Po}$ outer perimeter of projection,
SP spacer projection on upper surface of basic substrate outside of the valve seat,
CP clenching projection of basic substrate,
12 elastomeric membrane,
121 recess/through hole of elastomeric membrane configured to fit with a clenching projection of basic substrate,
122 through hole of elastomeric membrane in register to the spacer projection of the basic substrate, top substrate,
131 through hole of top substrate, which is arranged in register to the valve seat,
132 recess/through hole of top substrate configured to fit with a clenching projection of basic substrate,
$P_{TH}$ perimeter of through hole in top substrate,
MC microfluidic channel,
$MC_{UP}$ part of microfluidic channel upstream valve in direction of flow,
$MC_{DOWN}$ part of microfluidic channel downstream valve in direction of flow,
MCN microfluidic channel network,
$d_{EM}$ thickness of elastomeric membrane in relaxed state,
$d_{BTLS}$ distance between the upper surface of the basic substrate and the lower surface plane of the top substrate measured perpendicular to the lower surface plane outside the perimeter $p_{Po}$ of the projection,
$d_{CR}$ distance between the upper surface of the basic substrate and the lower surface plane of the top substrate measured perpendicular to the lower surface plane within the perimeter of the central recess,
$d_P$ distance between the upper surface of the basic substrate and the lower surface plane of the top substrate measured perpendicular to the lower surface plane within the perimeters $p_{Pi}$ and $p_{Po}$ of the projection,
$d_{VS}$ between the upper surface of the basic substrate to the lower surface plane of the top substrate measured perpendicular to the lower surface plane in the valve seat surface area between the perimeters $p_{CR}<p_V$ and $p_V=p_{Pi}$ projection, $d_{CP}$ distance from the upper surface of the basic substrate to the upper surface of the clenching projection measured perpendicular to upper surface plane of the basic substrate, $d_{SP}$ distance from the upper surface of the basic substrate to the upper surface of the spacer projection measured perpendicular to the upper surface basic of the basic substrate, $d_{BSEM}$ distance from the upper surface of the basic substrate to lower surface of elastomeric membrane measured perpendicular to the upper surface of the basic substrate, 2 valve actuator.

The invention claimed is:

1. A microfluidic valve assembly for controlling flow of a liquid in a microfluidic channel, comprising:
    at least one microfluidic valve comprising:
        a basic substrate having opposed upper and lower surfaces,
        an elastomeric membrane with a thickness d in relaxed state,
        a top substrate respectively having opposed upper and lower surfaces,
        wherein the top substrate is secured to the basic substrate, thereby clamping the elastomeric membrane between the upper surface of the basic substrate and the lower surface of the top substrate,
        wherein the basic substrate comprises on the basic substrate upper surface a valve seat with a perimeter $p_V=x$ comprising a central recess with a perimeter $p_{CR} \leq x$, and a projection surrounding the valve seat with an inner perimeter $p_{Pi} \geq x$ and an outer perimeter $p_{Po} > p_{Pi}$,
    wherein a distance between the upper surface of the basic substrate and the lower surface plane of the top substrate measured perpendicular to the lower surface plane respectively is $d_{BTLS} \geq d$ outside the perimeter $p_{Po}$ of the projection, is $d_{CR} > d$ within the perimeter pcR of the central recess, and is $d_P < d$ between the perimeters $p_{Pi}$ and $p_{Po}$ of the projection,
    wherein the top substrate has a through hole from the top substrate lower surface to the top substrate upper surface with a perimeter $p_{TH} \leq p_{Pi}$, which is arranged in register to the valve seat, thereby providing access for a valve actuator,
    wherein the central recess forms on the upper surface of the basic substrate a recess of longitudinal shape and comprises an inlet opening and a separate outlet opening, which are respectively connected to microfluidic channels upstream and downstream of the valve seat by respective connection channels, and wherein the connection channels are independently of each other arranged in angular position to the upper surface of the basic substrate, and
    the elastomeric membrane is configured to not be in contact with a surface of the central recess in an open valve state, thereby forming a valve cavity, which fluidly connects the connection channels upstream and downstream of the valve seat, and to be deformable by the valve actuator so that in a closed valve state, the elastomeric membrane closes the fluidic connection between the inlet and outlet openings in the central recess; wherein:
    the thickness d ranges between 0.7 mm and 1.8 mm;
    the elastic membrane is deformable and has a hardness on a Shore scale in a range of 30 to 75;
    the perimeter of the valve seat $p_V$ ranges between 1 mm and 25 mm;
    the perimeter of the central recess $p_{CR}$ ranges between 600 μm to 12.5 mm;
    the inner perimeter $p_{Pi}$ of the projection ranges between 1 mm and 25 mm;
    the outer perimeter $p_{Po}$ of the projection ranges between 1.5 mm and 40 mm:
    the perimeter $p_{TH}$ is $\leq 25$ mm;
    the distance $d_{BTLS}$ ranges between d to 1.2d;
    the distance $d_{CR}$ ranges between 1.1d to 1.8d; and
    the distance $d_P$ ranges between 0.3d to 0.65d.

2. The microfluidic valve assembly according claim 1, wherein in the open valve state the valve cavity has a volume of $V_{VC} \leq 3*D^3$, wherein D is a larger of the hydraulic diameters of the inlet and outlet connection channels, wherein the hydraulic diameter D is defined as $D=4A/p$, where A is a cross-sectional area of the respective connection channel at the inlet opening or outlet opening, respectively, and p is a cross-section perimeter, wherein the $V_{VC} \leq 2$ μL (micro liter) and the inlet and outlet openings have a hydraulic diameter D in a range of 0.3 to 0.87 mm; wherein A is in a range of 0.008 mm² to 3.1 mm².

3. The microfluidic valve assembly according to claim 1, wherein at least one chosen from the inlet and outlet openings is arranged in a part of the central recess with the largest distance $d_{CR}$.

4. The microfluidic valve assembly according to claim 1, wherein the projection forms on an upper surface plane of the basic substrate and has at least one chosen from a round shape, a ring shape, an oval shape, and an angular shape.

5. The microfluidic valve assembly according to claim 1, wherein the central recess is spaced from the perimeter of the valve seat by $p_{CR} < pV = p_{Pi} \leq p_{Po}$ and the lower surface of the elastomeric membrane is at least in contact with a surface of the projection and the upper surface of the basic substrate between the inner perimeter of the projection $p_{Pi}$ and the perimeter of the central recess $p_{CR}$ such that in the open valve state the valve cavity includes the volume of the central recess.

6. The microfluidic valve assembly according to claim 5, wherein a valve seat surface area between the perimeters $p_{CR} < p_V$ and $p_V = p_{Pi}$ has a distance $d_{VS}$ from the upper surface of the basic substrate to a lower surface plane of the top substrate measured perpendicular to the lower surface plane $d_P < d_{VS} \leq d$.

7. The microfluidic valve assembly according to claim 1, wherein the lower surface of the top substrate and the upper surface of the elastomeric membrane are flush-mounted to each other.

8. The microfluidic valve assembly according to claim 1, wherein the at least one microfluid valve includes at least two microfluid valves, and further comprising a microfluidic channel network connected to the at least two microfluid valves.

9. The microfluidic valve assembly according to claim 8, wherein the elastomeric membrane covers at least two of the at least two microfluidic valves.

10. The microfluidic valve assembly according to claim 8, wherein the microfluidic channels upstream and downstream of the respective at least two microfluidic valves are arranged as respective recesses in the lower surface of the basic substrate respectively connected to the inlet and the outlet openings of the central recess by the separate connection channels, which are configured as separate through holes from the lower surface to the upper surface of the basic substrate, wherein the through holes are respectively arranged perpendicular to the upper surface of the basic substrate, and wherein the lower surface of the basic substrate is coated with a coating material thereby closing the respective recesses in the lower surface of the basic substrate and forming the respective microfluidic channels.

11. The microfluidic valve assembly according to claim 8, wherein the basic substrate comprises on the basic substrate upper surface outside of the valve seat, and outside the perimeter $p_{Po}$ of the projection, one or more clamping projections, with a distance $d_{CP}$>d from the upper surface of the basic substrate to the upper surface of the clamping projection measured perpendicular to an upper surface plane of the basic substrate, and wherein the elastomeric membrane and the top substrate respectively comprise in register to the one or more clamping projections one or more recesses configured to fit with the one or more clamping projections.

12. The microfluidic valve assembly according to claim 11, wherein the distance $d_{CP}$ of the one or more clamping projections prior to securing the elastomeric membrane and top substrate to the basic substrate is larger than a distance dBms from the upper surface of basic substrate to the lower surface plane of the top substrate measured perpendicular to the lower surface plane of the top substrate with $d_{CP}$>$d_{BTLS}$, wherein $d_{CP}$ is in addition smaller than a distance $d_{BTUS}$ from the upper surface of basic substrate to an upper surface plane of the top substrate measured perpendicular to the upper surface plane of the top substrate with $d_{BTUS}$>$d_{CP}$>$d_{BTLS}$, and wherein the clamping projections are deformed in part after positioning the elastomeric membrane and top substrate in order to clamp the elastomeric membrane between the upper surface of the basic substrate and lower surface of the top substrate.

13. The microfluidic valve assembly according to claim 8, wherein the basic substrate comprises on the basic substrate upper surface outside of the valve seat, and outside the perimeter $p_{Po}$ of the projection, one or more spacer projections, with a distance $d_{SP}$ from the upper surface of the basic substrate to the upper surface of the spacer projection measured perpendicular to an upper surface plane of the basic substrate with $d_{SP}$≥d, wherein the elastomeric membrane comprises in register to the one or more spacer projections respective one or more through holes arranged perpendicular to the lower surface of the top substrate, and wherein the top substrate does not comprise in register to the one or more spacer projections respective one or more counterpart recesses or through holes arranged perpendicular to the lower surface of the top substrate.

14. A process for producing a microfluidic valve, the process comprising the following steps:
 a. providing at least one microfluidic valve comprising:
  a basic substrate,
  an elastomeric membrane, and
  a top substrate,
  wherein the basic substrate has an upper surface and lower surface and comprises on the upper surface a valve seat with a perimeter $p_V$=x comprising a central recess with a perimeter $p_{CR}$<x, and a projection surrounding the valve seat with an inner perimeter $p_{Pi}$≥x and an outer perimeter $p_{Po}$>$P_{Pi}$,
  wherein the central recess comprises an inlet opening and a separate outlet opening, which are respectively connected to microfluidic channels upstream and downstream of the valve seat by respective connection channels, and wherein the connection channels are independently of each other arranged in angular position to the upper surface of the basic substrate, and wherein the central recess forms on the upper surface of the basic substrate a recess of longitudinal shape,
  wherein the elastomeric membrane has opposed upper and lower surfaces and a thickness d in relaxed state,
  wherein the top substrate has opposed upper and lower surfaces and has a through hole from the top substrate lower surface to the top substrate upper surface with a perimeter $p_{TH}$≤$p_{Pi}$,
 b. arranging the lower surface of the elastomeric membrane on the upper surface of the basic substrate and arranging the lower surface of the top substrate on the upper surface of the elastomeric membrane, thereby arranging the through hole of the top substrate having a perimeter $p_{TH}$≤$p_{Pi}$ in register to the perimeter $p_V$ of the valve seat, and
 c. securing the top substrate to the basic substrate thereby clamping the elastomeric membrane to the basic substrate such that the valve seat is sealed in an upper direction, whereby the elastomeric membrane is configured to not be in contact with a surface of the central recess in an open valve state, thereby forming a valve cavity which fluidly connects the connection channels upstream and downstream of the valve seat, and to be deformable by a valve actuator so that in a closed valve state, the elastomeric membrane closes the fluidic connection between the inlet and outlet openings in the central recess; wherein:
 the thickness d ranges between 0.7 mm and 1.8 mm;
 the elastic membrane is deformable and has a hardness on a Shore scale in a range of 30 to 75;
 the perimeter of the valve seat $p_V$ ranges between 1 mm and 25 mm;
 the perimeter of the central recess $p_{CR}$ ranges between 600 μm to 12.5 mm;
 the inner perimeter $p_{Pi}$ of the projection ranges between 1 mm and 25 mm;
 the outer perimeter $p_{Po}$ of the projection ranges between 1.5 mm and 40 mm:
 the perimeter $p_{TH}$ is ≥25 mm;
 the distance $d_{BTLS}$ ranges between d to 1.2d;
 the distance $d_{CR}$ ranges between 1.1d to 1.8d; and
 the distance $d_P$ ranges between 0.3d to 0.65d.

15. A method for controlling flow of a liquid composition in a microfluidic channel of a microfluidic channel network, comprising:
 providing at least one microfluidic valve comprising:
  a basic substrate having opposed upper and lower surfaces,
  an elastomeric membrane with a thickness d in relaxed state,
  a top substrate respectively having opposed upper and lower surfaces,
  wherein the top substrate is secured to the basic substrate, thereby lamping the elastomeric membrane between the upper surface of the basic substrate and the lower surface of the top substrate,
  wherein the basic substrate comprises on the basic substrate upper surface a valve seat with a perimeter $p_V$=x comprising a central recess with a perimeter $p_{CR}$≥x, and a projection surrounding the valve seat with an inner perimeter $p_{Pi}$≤x and an outer perimeter $p_{Po}$>$P_{Pi}$,
  wherein a distance between the upper surface of the basic substrate and the lower surface plane of the top substrate measured perpendicular to the lower surface plane respectively is $d_{BTLS}$≤d outside the perimeter $p_{Po}$ of the projection, is $d_{CR}>d$ within the perimeter $p_{CR}$ of the central recess, and is $d_P<d$ between the perimeters $p_{Pi}$ and $p_{Po}$ of the projection, wherein the top substrate has a through hole from the top substrate lower surface to the top substrate upper surface with a perimeter $p_{TH} \geq p_{Pi}$, which is arranged in register to the valve seat, thereby providing access for a valve actuator, wherein the central recess forms on the upper surface of the basic substrate a recess of longitudinal shape and comprises an inlet opening and a separate outlet opening, which are respectively connected to microfluidic channels upstream and downstream of the valve seat by respective connection channels, and wherein the connection channels are independently of each other arranged in angular position to the upper surface of the basic substrate, and the elastomeric membrane is configured to not be in contact with a surface of the central recess in an open valve state, thereby forming a valve cavity, which fluidly connects the connection channels upstream and downstream of the valve seat, and to be deformable by the valve actuator so that in a closed valve state, the elastomeric membrane closes the fluidic connection between the inlet and outlet openings in the central recess, wherein:

the thickness d ranges between 0.7 mm and 1.8 mm;

the elastic membrane is deformable and has a hardness on a Shore scale in a range of 30 to 75;

the perimeter of the valve seat $p_V$ ranges between 1 mm and 25 mm;

the perimeter of the central recess $p_{CR}$ ranges between 600 μm to 12.5 mm;

the inner perimeter $p_{Pi}$ of the projection ranges between 1 mm and 25 mm;

the outer perimeter $p_{Po}$ of the projection ranges between 1.5 mm and 40 mm:

the perimeter $p_{TH}$ is 25 mm;

the distance $d_{BTLS}$ ranges between d to 1.2d;

the distance $d_{CR}$ ranges between 1.1d to 1.8d; and the distance $d_P$ ranges between 0.3d to 0.65d;

operating the valve actuator to place the at least one microfluidic valve in the open state to connect the connection channels upstream and downstream of the valve seat or to place the at least one microfluidic valve in the closed state to disconnect the connection channels upstream and downstream of the valve seat.

16. The method according to claim 15, wherein:

the perimeter of the valve seat $p_V$ ranges between 10 mm and 16 mm;

the perimeter of the central recess $p_{CR}$ ranges between 5 mm and 10 mm;

the inner perimeter $p_{Pi}$ of the projection ranges between 10 mm and 16 mm;

the outer perimeter $p_{Po}$ of the projection ranges between 15 mm and 30 mm;

the perimeter $p_{TH}$ is ≥16 mm.

17. The method according to claim 16, wherein:

the perimeter of the valve seat $p_V$ is approximately 13 mm;

the perimeter of the central recess $p_{CR}$ is approximately 7.5 mm;

the inner perimeter $p_{Pi}$ of the projection is approximately 13 mm;

the outer perimeter $p_{Po}$ of the projection is approximately 22 mm.

18. The microfluidic valve assembly according to claim 1, wherein:

the perimeter of the valve seat $p_V$ ranges between 10 mm and 16 mm;

the perimeter of the central recess $p_{CR}$ ranges between 5 mm and 10 mm;

the inner perimeter $p_{Pi}$ of the projection ranges between 10 mm and 16 mm;

the outer perimeter $p_{Po}$ of the projection ranges between 15 mm and 30 mm;

the perimeter $p_{TH}$ is ≥16 mm.

19. The microfluidic valve assembly according to claim 18, wherein:

the perimeter of the valve seat $p_V$ is approximately 13 mm;

the perimeter of the central recess $p_{CR}$ is approximately 7.5 mm;

the inner perimeter $p_{Pi}$ of the projection is approximately 13 mm;

the outer perimeter $p_{Po}$ of the projection is approximately 22 mm.

20. The process according to claim 14, wherein:

the perimeter of the valve seat $p_V$ ranges between 10 mm and 16 mm;

the perimeter of the central recess $p_{CR}$ ranges between 5 mm and 10 mm;

the inner perimeter $p_{Pi}$ of the projection ranges between 10 mm and 16 mm;

the outer perimeter $p_{Po}$ of the projection ranges between 15 mm and 30 mm;

the perimeter $p_{TH}$ is ≥16 mm.

* * * * *